United States Patent
Ota et al.

(10) Patent No.: US 12,142,502 B2
(45) Date of Patent: Nov. 12, 2024

(54) PROCESSING CONDITION SELECTION METHOD, SUBSTRATE PROCESSING METHOD, SUBSTRATE PRODUCT PRODUCTION METHOD, PROCESSING CONDITION SELECTING DEVICE, COMPUTER PROGRAM, AND STORAGE MEDIUM

(71) Applicant: SCREEN Holdings Co., Ltd., Kyoto (JP)

(72) Inventors: Takashi Ota, Kyoto (JP); Makoto Takaoka, Kyoto (JP); Toru Edo, Kyoto (JP); Hiroshi Horiguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 390 days.

(21) Appl. No.: 17/438,975

(22) PCT Filed: Jan. 21, 2020

(86) PCT No.: PCT/JP2020/001915
§ 371 (c)(1),
(2) Date: Sep. 14, 2021

(87) PCT Pub. No.: WO2020/188992
PCT Pub. Date: Sep. 24, 2020

(65) Prior Publication Data
US 2022/0148896 A1    May 12, 2022

(30) Foreign Application Priority Data

Mar. 15, 2019   (JP) ................................ 2019-048214

(51) Int. Cl.
*H01L 21/67* (2006.01)
(52) U.S. Cl.
CPC .... *H01L 21/67253* (2013.01); *H01L 21/6708* (2013.01)

(58) Field of Classification Search
CPC .......... H01L 21/67253; H01L 21/6708; H01L 21/31111; H01L 21/67051; H01L 21/30604; H01L 21/31133
(Continued)

(56) References Cited

U.S. PATENT DOCUMENTS 6,160,621 A    12/2000  Perry et al. .................... 356/381
6,768,552 B2    7/2004  Takahashi et al. ........... 356/479
(Continued)

FOREIGN PATENT DOCUMENTS

CN          103173766 A     6/2013
JP          H10-275753 A   10/1998
(Continued)

OTHER PUBLICATIONS

International Search Report mailed Mar. 17, 2020 in corresponding PCT International Application No. PCT/JP2020/001915.
(Continued)

*Primary Examiner* — Duy Vu N Deo
(74) *Attorney, Agent, or Firm* — OSTROLENK FABER LLP

(57) ABSTRACT

A processing condition selection method includes a step (S21) and a step (S22). In the step (S21), a thickness pattern TM that represents a distribution of thicknesses measured at respective measurement points on a target is compared to pre-stored reference patterns (RP) to specify a reference pattern (RP) having a high correlation with the thickness pattern (TM) from among the reference patterns (RP) based on a prescriptive rule. In the step (S22), a reference processing condition associated with the specified reference pattern (RP) is acquired as a processing condition for the target from among reference processing conditions associated with the respective reference patterns (RP). The reference patterns (RP) each represent a distribution of physical
(Continued)

quantities of a corresponding one of reference targets. The reference processing conditions each are a processing condition when processing is previously performed on a corresponding one of the reference targets with a corresponding one of the reference patterns (RP).

18 Claims, 10 Drawing Sheets

(58) Field of Classification Search
USPC .................................................. 438/745–754
See application file for complete search history.

(56) References Cited

U.S. PATENT DOCUMENTS

| | | | |
|---|---|---|---|
| 7,249,343 B2 | 7/2007 | Okuno | 716/21 |
| 7,252,778 B2 | 8/2007 | Iwamoto et al. | 216/84 |
| 7,407,821 B2 | 8/2008 | Wang et al. | 438/16 |
| 7,541,293 B2 | 6/2009 | Iwamoto et al. | 438/745 |
| 7,736,998 B2 | 6/2010 | Morita et al. | 438/459 |
| 9,389,601 B2 | 7/2016 | Nakamura et al. | |
| 9,460,944 B2 | 10/2016 | Fujiwara et al. | 438/748 |
| 9,734,989 B2 | 8/2017 | Kodaira et al. | |
| 10,026,591 B2 | 7/2018 | Kodaira et al. | |
| 10,217,606 B2 | 2/2019 | Ito | |
| 10,261,504 B2 | 4/2019 | Chung et al. | |
| 10,403,516 B2 | 9/2019 | Kuboi et al. | |
| 10,935,969 B2 | 3/2021 | Chung et al. | |
| 2003/0109137 A1 | 6/2003 | Iwamoto et al. | 438/689 |
| 2003/0121889 A1 | 7/2003 | Takahashi et al. | 216/84 |
| 2005/0000940 A1 | 1/2005 | Iwamoto et al. | 216/83 |
| 2005/0009213 A1 | 1/2005 | Wang et al. | 438/5 |
| 2005/0015736 A1 | 1/2005 | Okuno | 716/2 |
| 2006/0244078 A1 | 11/2006 | Iwamoto et al. | 257/397 |
| 2007/0199657 A1 | 8/2007 | Kofuji et al. | 156/345.24 |
| 2008/0063840 A1 | 3/2008 | Morita et al. | 428/156 |
| 2008/0154422 A1 | 6/2008 | Kofuji et al. | 700/121 |
| 2009/0023270 A1* | 1/2009 | Akiyama | H01L 21/76254 257/E21.568 |
| 2014/0121791 A1 | 5/2014 | Nakamura et al. | 700/90 |
| 2014/0242731 A1* | 8/2014 | Mauer | G06F 30/00 156/345.16 |
| 2015/0311129 A1* | 10/2015 | Miller | H01L 21/3065 156/345.25 |
| 2015/0318185 A1 | 11/2015 | Kodaira et al. | |
| 2016/0005630 A1 | 1/2016 | Fujiwara et al. | |
| 2016/0041548 A1 | 2/2016 | Chung et al. | |
| 2016/0111296 A1 | 4/2016 | Yun | |
| 2016/0126150 A1* | 5/2016 | Goldberg | H01L 22/12 438/8 |
| 2017/0207107 A1 | 7/2017 | Kuboi et al. | |
| 2017/0287793 A1* | 10/2017 | Mauer | G06F 17/11 |
| 2017/0316918 A1 | 11/2017 | Kodaira et al. | |
| 2018/0033592 A1 | 2/2018 | Ito et al. | |
| 2018/0277423 A1* | 9/2018 | Lottes | H01L 21/67115 |
| 2019/0187674 A1 | 6/2019 | Chung et al. | |

FOREIGN PATENT DOCUMENTS

| | | |
|---|---|---|
| JP | 2000-216099 A | 8/2000 |
| JP | 2001-313279 A | 11/2001 |
| JP | 2002-134466 A | 5/2002 |
| JP | 2003-100702 A | 4/2003 |
| JP | 2004-071862 A | 3/2004 |
| JP | 2004-335923 A | 11/2004 |
| JP | 2005-015885 A | 1/2005 |
| JP | 2005-051210 A | 2/2005 |
| JP | 2005-136345 A | 5/2005 |
| JP | 2005-340622 A | 12/2005 |
| JP | 2006-066779 A | 3/2006 |
| JP | 2007-123638 A | 5/2007 |
| JP | 2007-234762 A | 9/2007 |
| JP | 2007-266335 A | 10/2007 |
| JP | 2008-034877 A | 2/2008 |
| JP | 2009-218300 A | 9/2009 |
| JP | 2011-238957 A | 11/2011 |
| JP | 2014-232825 A | 12/2014 |
| JP | 2016-032064 A | 3/2016 |
| JP | 2017-135414 A | 8/2017 |
| JP | 2018-019019 A | 2/2018 |
| KR | 10-2014-0052822 A | 5/2014 |
| KR | 10-2016-0004209 A | 1/2016 |
| KR | 10-2016-0045299 A | 4/2016 |
| TW | I641934 B | 11/2018 |
| WO | WO 2017/176641 A1 | 10/2017 |

OTHER PUBLICATIONS

Written Opinion mailed Mar. 17, 2020 in corresponding PCT International Application No. PCT/JP2020/001915.
Office Action dated May 5, 2021 in corresponding Taiwanese Patent Application No. 109100285.
Notice of Allowance issued Oct. 4, 2022 for corresponding Japanese Patent Application No. 2019-048214.
Notice of Allowance dated Nov. 20, 2023 for corresponding Korean Patent Application No. 10-2021-7032961.

* cited by examiner

PROCESSING CONDITION SELECTION METHOD, SUBSTRATE PROCESSING METHOD, SUBSTRATE PRODUCT PRODUCTION METHOD, PROCESSING CONDITION SELECTING DEVICE, COMPUTER PROGRAM, AND STORAGE MEDIUM

CROSS-REFERENCE TO RELATED APPLICATIONS

The present application is a 35 U.S.C. §§ 371 national phase conversion of International Application No. PCT/JP2020/001915, filed Jan. 21, 2020, which claims priority to Japanese Patent Application No. 2019-048214, filed Mar. 15, 2019, the contents of both of which are incorporated herein by reference. The PCT International Application was published in the Japanese language.

TECHNICAL FIELD

The present invention relates to a processing condition selection method, a substrate processing method, a substrate product production method, a processing condition selecting device, a computer program, and a storage medium.

BACKGROUND ART

The semiconductor device disclosed in Patent Literature 1 creates a correspondence table to determine a time for etching an insulating film formed on a semiconductor substrate. The correspondence table contrasts a time for etching the insulating film with an average value of film thicknesses of a stopper film formed on the semiconductor substrate.

CITATION LIST

Patent Literature

[Patent Literature 1]
   Japanese Patent Application Laid-Open Publication No. 2004-71862

SUMMARY OF INVENTION

Technical Problem

However, the correspondence table in the semiconductor device disclosed in Patent Literature 1 only contrasts the time for etching the insulating film with the average value of the film thicknesses obtained from a result of film thickness measurement of the stopper film at 25 specific points on the substrate.

By contrast, the present inventors have knowledge part that etching at a given point (also referred to below as "point LC") on a substrate affects the distribution of film thicknesses in the vicinity of the point LC.

As such, even if the correspondence table defines a favorable etching time relative to the average value of the film thicknesses at the 25 specific points on the substrate, it is not necessarily possible to favorably etch the insulating film across a wide area of the substrate. Therefore, observation of a wide area of the substrate may find variation in thickness of the insulating film after being etched.

In other words, variation may occur in the thickness of a target after being processed with a processing liquid such as an etching liquid.

The present invention has been made in view of the foregoing and has its object of providing a processing condition selection method, a substrate processing method, a substrate product production method, a processing condition selecting device, a computer program, and a storage medium that can reduce the range of thickness variation across a wide area of a target constituting a substrate after being processed.

Solution to Problem

According to an aspect of the present invention, in a processing condition selection method, a processing condition usable in processing a target constituting a substrate with a processing liquid is selected from among a plurality of reference processing conditions. The processing condition selection method includes: measuring a thickness of the target before being processed with the processing liquid at each of a plurality of measurement points on the target; specifying a reference pattern having a high correlation with the thickness pattern among the reference patterns based on a prescriptive rule by comparison of a thickness pattern that represents a distribution of thicknesses measured at the measurement points to each of a plurality of reference patterns pre-stored in storage; and acquiring from the storage a reference processing condition, as the processing condition, associated with the specified reference pattern among the reference processing conditions associated with the respective reference patterns. The reference patterns each represent a distribution of physical quantities of a corresponding one of reference targets. The reference processing conditions each are a processing condition when processing with the processing liquid is previously performed on a corresponding one of the reference targets with a corresponding one of the reference patterns.

In the processing condition selection method according to the present invention, each of the plurality of reference patterns is pre-classified into any of a plurality of reference groups. The reference groups are defined based on shape characteristics of the plurality of reference patterns. The specifying the reference pattern includes: classifying the thickness pattern into any of the reference groups; and determining the reference pattern having the high correlation with the thickness pattern by comparison of the thickness pattern to each of two or more reference patterns as to-be-referenced patterns among the plurality of reference patterns based on the prescriptive rule, the two or more reference patterns being reference patterns classified into the reference group into which the thickness pattern is classified.

In the processing condition selection method according to the present invention, the reference groups include at least one of a first reference group, a second reference group, and a third reference group. The first reference group is a group of a pattern with a minimum spot between a center part and an edge part of the target or one of the reference targets. The second reference group is a group of a pattern with a maximum spot between the center part and the edge part of the target or one of the reference targets. The third reference group is a group of a pattern inclining in one direction from the center part to the edge part of the target or one of the reference targets.

In the processing condition selection method according to the present invention, it is preferable that when a reference group of the reference groups into which the thickness pattern is classified is the first reference group, in the determining the reference group, comparison of a first difference based on the thickness pattern to each of second differences based on the respective reference patterns is performed and the reference pattern having the high correlation with the thickness pattern is determined based on a result of the comparison of the first difference to each of the second differences. The first difference is a difference between a thickness of the target indicated by a minimum spot of the thickness pattern and a thickness of the edge part of the target indicated by an edge part of the thickness pattern. The second differences are differences between respective physical quantities of the reference targets indicated by the minimum spots of the respective reference patterns and respective physical quantities of the edge parts of the reference targets indicated by edge parts of the respective reference patterns.

In the processing condition selection method according to the present invention, it is preferable that when a reference group of the reference groups into which the thickness pattern is classified is the second reference group, in the determining the reference group, comparison of a first distance based on the thickness pattern to each of second distances based on the respective reference patterns is performed and the reference pattern having the high correlation with the thickness pattern is determined based on a result of the comparison of the first distance to each of the second distances. The first distance is a distance from the center part of the target to a point corresponding to a maximum spot of the thickness pattern. The second distances are distances from the center parts of the respective reference targets to points corresponding to maximum spots of the respective reference patterns.

In the processing condition selection method according to the present invention, it is preferable that when a reference group of the reference groups into which the thickness pattern is classified is the third reference group, in the determining the reference group, comparison of an inclination of the thickness pattern to each of inclinations of the respective reference patterns is performed and the reference pattern having the high correlation with the thickness pattern is determine based on a result of the comparison of the inclination of the thickness pattern to each of the inclinations of the respective reference patterns.

In the processing condition selection method according to the present invention, preferably, the specifying the reference pattern includes: making a dimension of the thickness pattern and a dimension of the reference patterns the same as each other; and in the determining the reference pattern, the reference pattern having the high correlation with the thickness pattern is determined based on the prescriptive rule after the making the dimension of the thickness pattern and the dimension of the reference patterns the same as each other.

In the processing condition selection method according to the present invention, each of the reference processing conditions includes information indicating a rotational speed of a substrate that includes a corresponding one of the reference targets, information indicating a turning point of a nozzle that discharges the processing liquid to the corresponding one of the reference targets, and information indicating a moving speed of the nozzle along the corresponding one of the reference targets.

The processing condition selection method according to the present invention preferably further includes performing comparison of a first characteristic quantity indicating a characteristic of the thickness pattern to each of second characteristic quantities indicating characteristics of the respective reference patterns and adjusting the information indicating the moving speed of the nozzle included in the processing condition acquired in the acquiring from the storage based on a result of the comparison of the first characteristic quantity to each of the second characteristic quantities. The first characteristic quantity represents an extreme value of the thickness pattern, a thickness of a center part of the target indicated by the thickness pattern, or a thickness of an edge part of the target indicated by the thickness pattern. The second characteristic quantities represent respective extreme values of the reference patterns, respective reference physical quantities of center parts of the targets indicated by the respective reference patterns, or respective physical quantities of edge parts of the reference targets indicated by the respective reference patterns.

In the processing condition selection method according to the present invention, it is possible that in the specifying the reference pattern, the reference pattern having the high correlation with the thickness pattern is specified based on a result of user input to an input device.

It is preferable that the processing condition selection method according to the present invention further includes displaying on a display device information utilized for specification or adjustment of the reference pattern having the high correlation with the thickness pattern of the target before being processed with the processing liquid or information utilized for evaluation of the thickness pattern of the target after being processed with the processing liquid.

In the processing condition selection method according to the present invention, the processing liquid preferably is an etching liquid for etching the target. Preferably, the physical quantities each are an etch rate or an etching amount.

In the processing condition selection method according to the present invention, the processing liquid is an etching liquid for etching the target. Preferably, the physical quantities each are an etch rate or an etching amount.

According to another aspect of the present invention, a substrate processing method includes: the processing condition selection method according to the one aspect; and processing the target with the processing liquid under the processing condition selected in the processing condition selection method.

It is preferable that the substrate processing method according to the present invention further includes measuring a thickness of the target after being processed with the processing liquid at each of the measurement points on the target after being processed.

It is preferable that the substrate processing method according to the present invention further include storing in association with each other the thickness pattern before the processing that represents the distribution of the thicknesses of the target before being processed, the reference pattern having a high correlation with the thickness pattern before the processing, the processing condition, and a thickness pattern after the processing that represents a distribution of thicknesses of the target after being processed in the storage.

It is preferable that the substrate processing method according to the present invention further include storing in the storage the thickness pattern before the processing that represents the distribution of the thicknesses of the target before being processed, the reference pattern having a high correlation with the thickness pattern before the processing, the processing condition, a thickness pattern after the processing that represents a distribution of thicknesses of the target after being processed, and a result of the evaluation for the thickness pattern after the processing in association with each other.

According to a still another aspect of the present invention, in a substrate product production method, the substrate is processed by the substrate processing method according to another aspect to produce a substrate product that is the substrate after being processed.

According to yet another aspect of the present invention, a processing condition selecting device selects a processing condition usable in processing a target constituting a substrate with a processing liquid from among a plurality of processing conditions. The processing condition selecting device includes a thickness measuring section, storage, a specifying section, and an acquiring section. The thickness measuring section measures a thickness of the target before being processed with the processing liquid at each of a plurality of measurement points on the target. The storage pre-stores therein a plurality of reference patterns that each represent a distribution of physical quantities of a corresponding one of the reference targets. The specifying section specifies a reference pattern having a high correlation with the thickness pattern from among the reference patterns based on a prescriptive rule by comparison of a thickness pattern that represents a distribution of thicknesses measured at the respective measurement points to each of the reference patterns. The acquiring section acquires as the processing condition a reference processing condition associated with the specified reference pattern among reference processing conditions associated with the respective reference patterns from the storage. The reference processing conditions each are a processing condition when processing with the processing liquid is previously performed on a corresponding one of the reference targets with a corresponding one of the reference patterns.

According to still another aspect of the present invention, a computer program for selecting a processing condition usable in processing a target constituting a substrate with a processing liquid from among a plurality of reference processing conditions, wherein the computer program causes a computer to execute: measuring a thickness of the target before being processed with the processing liquid at each of a plurality of measurement points on the target; specifying a reference pattern having a high correlation with the thickness pattern among the reference patterns based on a prescriptive rule by comparison of a thickness pattern that represents a thickness distribution of thicknesses measured at the measurement points to each of a plurality of reference patterns pre-stored in storage; and acquiring from the storage a reference processing condition, as the processing condition, associated with the specified reference pattern among the reference processing conditions associated with the respective reference patterns. The reference patterns each represent a distribution of physical quantities of a corresponding one of reference targets. The reference processing conditions each are a processing condition when processing with the processing liquid is previously performed on a corresponding one of the reference targets with a corresponding one of the reference patterns.

According to yet another aspect of the present invention, a storage medium stores therein the computer program according to the above still another aspect of the present invention.

Advantageous Effects of Invention

According to the present invention, a processing condition selection method, a substrate processing method, a substrate product production method, a processing condition selecting device, a computer program and a storage medium can be provided that can reduce the range of thickness variation across a wide area of a target constituting a substrate after being processed.

DESCRIPTION OF EMBODIMENTS

Figure 1:
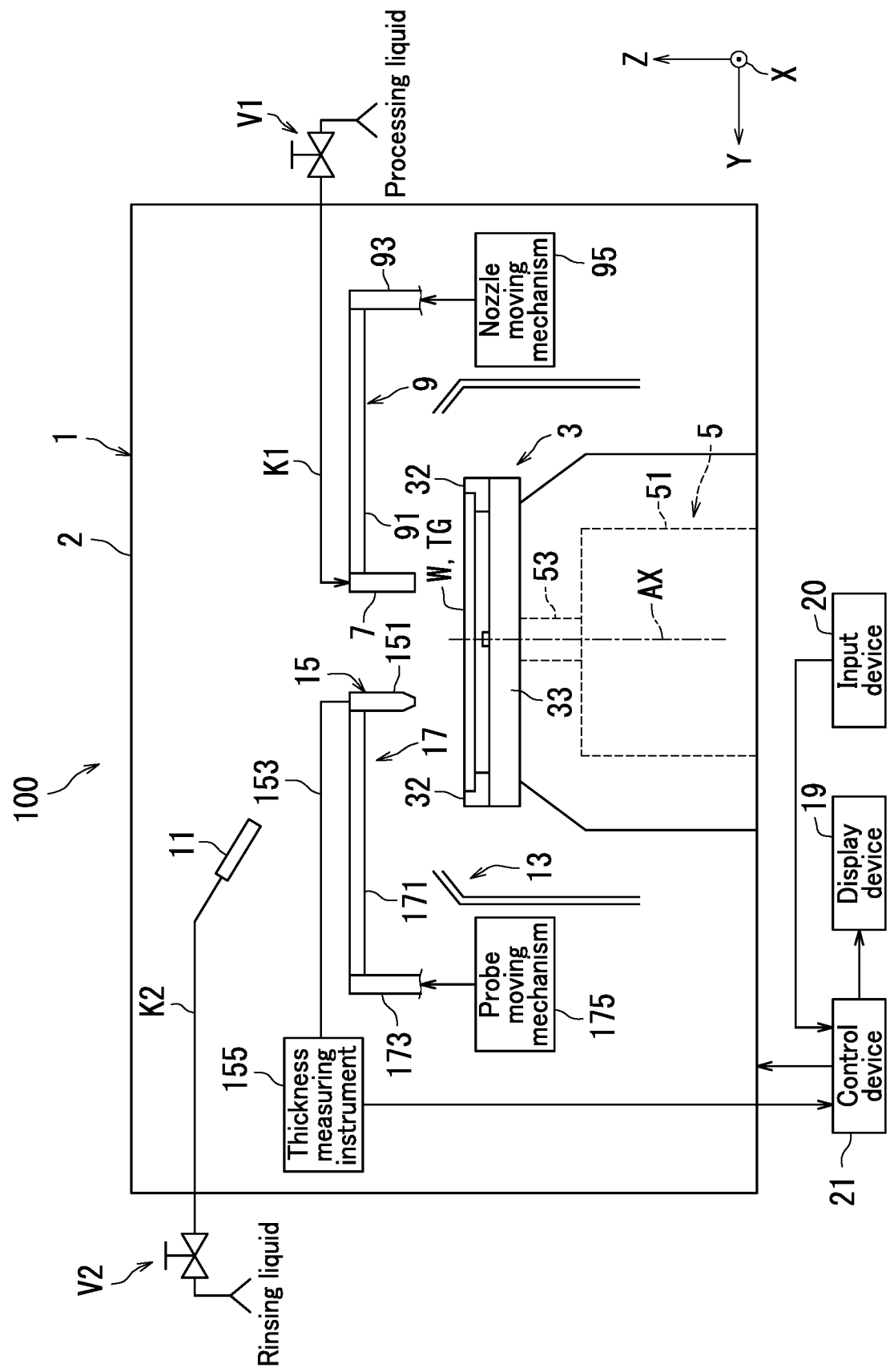
FIG. 1 is a diagram illustrating a substrate processing apparatus according to an embodiment of the present invention.

An embodiment of the present invention will be described below with reference to the accompanying drawings. Note that elements in the drawings that are the same or equivalent are labelled using the same reference signs and description thereof is not repeated. Also, in the embodiment of the present disclosure, an X axis, a Y axis, and a Z axis are perpendicular to one another, the X axis and the Y axis are parallel to a horizontal direction, and the Z axis is parallel to a vertical direction. Note that "plan view" refers to viewing an object from above in the vertical direction.

The following describes a substrate processing apparatus 100 according to an embodiment of the present invention with reference to FIGS. 1 to 11. First of all, the substrate processing apparatus 100 is described with reference to FIG. 1. FIG. 1 is a diagram illustrating the substrate processing apparatus 100. The substrate processing apparatus 100 illustrated in FIG. 1 processes a substrate W with a processing liquid.

Specifically, the substrate processing apparatus 100 processes an object constituting the substrate W with the processing liquid. In the following, an object that is a target for processing with the processing liquid may be referred to as "target TG". The target TG constituting the substrate W is for example a substrate body (e.g., a substrate body made of silicon) or a substance formed on the surface of the substrate body. Examples of the substance formed on the surface of the substrate body include a substance made of the same material as that of the substrate body (e.g., a layer made of silicon), and a substance made of a material different from that of the substrate body (e.g., a silicon oxide film, a silicon nitride film, or a resist). The "substance" may constitute a film.

The substrate processing apparatus 100 is of single wafer type by which substrates W are processed on a wafer-by-wafer basis. Each substrate W is substantially disk shaped.

Examples of the substrate W include a semiconductor wafer, a substrate for liquid-crystal display device use, a substrate for plasma display use, a substrate for field emission display (FED) use, a substrate for optical disk use, a substrate for magnetic disk use, a substrate for photomagnetic disk use, a substrate for photomask use, a ceramic substrate, and a substrate for solar cell use. In the following description of the embodiment, the substrate W is a semiconductor wafer.

In particular, the substrate processing apparatus 100 in the present embodiment functions as a "processing condition selecting device" that selects a processing condition usable in processing the target TG constituting the substrate W with the processing liquid from among a plurality of reference processing conditions.

As illustrated in FIG. 1, the substrate processing apparatus 100 includes a processing unit 1, a display device 19, an input device 20, a control device 21, a valve V1, a supply pipe K1, a valve V2, and a supply pipe K2.

The control device 21 controls the processing unit 1, the display device 19, the input device 20, the valve V1, and the valve V2. The display device 19 displays various information. The display device 19 is a liquid-crystal display, for example. The input device 20 receives user input and outputs information indicating an input result to the control device 21. The input device 20 includes a touch panel and a pointing device, for example. The touch panel is disposed for example on a display surface of the display device 19. The display device 19 and the input device 20 constitute a graphical interface, for example.

The processing unit 1 processes the substrate W by discharging the processing liquid to the substrate W. Specifically, the processing unit 1 includes a chamber 2, a spin chuck 3, a spin motor 5, a nozzle 7, a nozzle moving section 9, a nozzle 11, a plurality of guards 13 (two guards 13 in the present embodiment), a thickness measuring section 15, and a probe moving section 17.

The chamber 2 is substantially box shaped. The chamber 2 houses the substrate W, the spin chuck 3, the spin motor 5, the nozzle 7, the nozzle moving section 9, the nozzle 11, the guards 13, the thickness measuring section 15, the probe moving section 17, a part of the supply pipe K1, and a part of the supply pipe K2.

The spin chuck 3 rotates while holding the substrate W. Specifically, the spin chuck 3 rotates the substrate W about a rotation axis AX thereof while horizontally holding the substrate W in the chamber 2. Specifically, the spin chuck 3 is driven to rotate by the spin motor 5.

The spin chuck 3 includes a plurality of chuck members 32 and a spin base 33. The chuck members 32 are provided on the spin base 33 along the periphery of the substrate W. The chuck members 32 hold the substrate W with the substrate W in a horizontal posture. The spin base 33 is substantially disk shaped and supports the chuck members 32 with the chuck members 32 in a horizontal posture. The spin motor 5 rotates the spin base 33 about the rotation axis AX. The spin base 33 accordingly rotates about the rotation axis AX. As a result, the substrate W held on the chuck members 32 provided on the spin base 33 rotates about the rotation axis AX. Specifically, the spin motor 5 includes a motor main body 51 and a shaft 53. The shaft 53 is connected to the spin base 33. The motor main body 51 rotates the shaft 53 to rotate the spin base 33.

The nozzle 7 discharges the processing liquid toward the substrate W during rotation of the substrate W. The processing liquid is a chemical liquid.

The following describes a case in which the substrate processing apparatus 100 in the present embodiment performs etching processing on the substrate W (specifically, the target TG) and the processing liquid is an etching liquid. As such, the substrate processing apparatus 100 functions as a "processing condition selecting device" that selects a processing condition usable in etching processing of the target TG constituting the substrate W with the etching liquid from among a plurality of reference processing conditions.

Examples of the etching liquid include fluoro-nitric acid (a mixed liquid of hydrofluoric acid (HF) and nitric acid ($HNO_3$)), hydrofluoric acid, buffered hydrofluoric acid (BHF), ammonium fluoride, HFEG (a mixed liquid of hydrofluoric acid and ethylene glycol), and phosphoric acid ($H_3PO_4$).

The supply pipe K1 supplies the etching liquid to the nozzle 7. The valve V1 switches between supply start and supply stop of the etching liquid to the nozzle 7.

The nozzle moving section 9 moves the nozzle 7 in a substantially vertical direction and in a substantially horizontal direction. Specifically, the nozzle moving section 9 includes an arm 91, a rotational shaft 93, and a nozzle moving mechanism 95. The arm 91 extends in a substantially horizontal direction. The nozzle 7 is disposed at an end of the arm 91. The arm 91 is connected to the rotational shaft 93. The rotational shaft 93 extends in a substantially vertical direction. The nozzle moving mechanism 95 turns the rotational shaft 93 about a rotational axis thereof extending in a substantially vertical direction to turn the arm 91 along a substantially horizontal plane. As a result, the nozzle 7 moves along the substantially horizontal plane. Furthermore, the nozzle moving mechanism 95 raises and lowers the rotational shaft 93 in a substantially vertical direction to raise and lower the arm 91. As a result, the nozzle 7 moves in the substantially vertical direction. The nozzle moving mechanism 95 includes for example a ball screw mechanism and an electric motor that applies driving power to the ball screw mechanism.

The nozzle 11 discharges a rinsing liquid toward the substrate W during rotation of the substrate W. Examples of the rinsing liquid include deionized water, carbonated water, electrolytic ion water, hydrogen water, ozone water, and dilute hydrochloric acid water (e.g., at about 10 ppm to 100 ppm).

The supply pipe K2 supplies the rinsing liquid to the nozzle 11. The valve V2 switches between supply start and supply stop of the rinsing liquid to the nozzle 11.

The guards 13 each have a substantially cylindrical shape. Each of the guards 13 receives the processing liquid or the rinsing liquid flowing from the substrate W.

The thickness measuring section 15 measures the thickness of the target TG in a non-contact manner and outputs information indicating the thickness of the target TG to the control device 21. The thickness measuring section 15 measures the thickness of the target TG by interference spectroscopy, for example. Specifically, the thickness measuring section 15 includes an optical probe 151, a connection wire 153, and a thickness measuring instrument 155. The optical probe 151 includes a lens. The connection wire 153 connects the optical probe 151 to the thickness measuring instrument 155. The connection wire 153 includes optical fibers. The thickness measuring instrument 155 includes a light source and a photo detector. Light emitted by the light source of the thickness measuring instrument 155 is emitted to the target TG through the connection wire 153 and the optical probe 151. Light reflected by the target TG travels through the optical probe 151 and the connection wire 153 and then is received by the photo detector of the thickness measuring instrument 155. The thickness measuring instrument 155 analyzes the received light to calculate the thickness of the target TG based on a result of analysis. The thickness measuring instrument 155 outputs information indicating the thickness of the target TG to the control device 21.

The probe moving section 17 moves the optical probe 151 in a substantially vertical direction and in a substantially horizontal direction. Specifically, the probe moving section 17 includes an arm 171, a rotational shaft 173, and a probe moving mechanism 175. The arm 171 extends in a substantially horizontal direction. The optical probe 151 is disposed at an end of the arm 171. The arm 171 is connected to the rotational shaft 173. The rotational shaft 173 extends in a substantially vertical direction. The probe moving mechanism 175 turns the rotational shaft 173 about a rotational axis thereof extending in a substantially vertical direction to turn the arm 171 along a substantially horizontal plane. As a result, the optical probe 151 moves along a substantially horizontal plane. Furthermore, the probe moving mechanism 175 raises and lowers the rotational shaft 173 in a substantially vertical direction to raise and lower the arm 171. As a result, the optical probe 151 moves in a substantially vertical direction. The probe moving mechanism 175 includes for example a ball screw mechanism and an electric motor that applies drive power to the ball screw mechanism.

Figure 2:
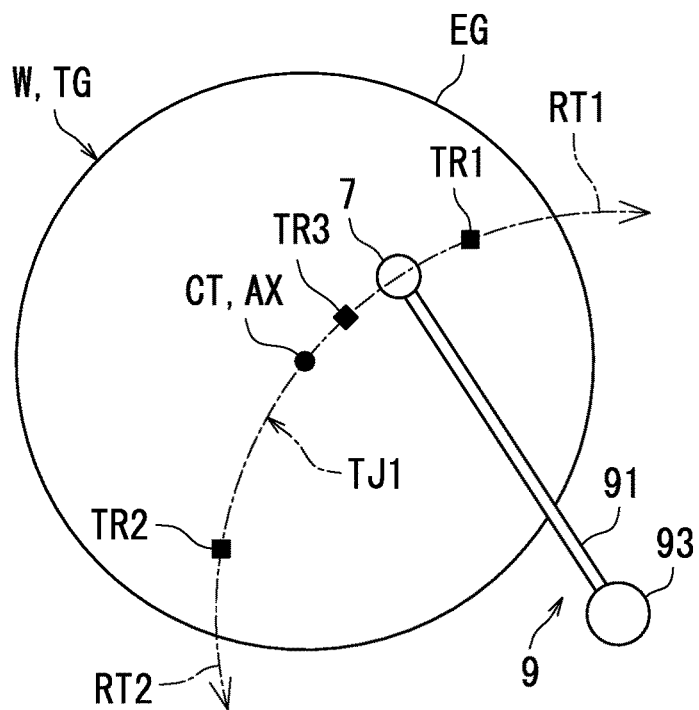
FIG. 2 is a plan view of scanning processing on a substrate using a nozzle of the substrate processing apparatus according to the embodiment.

Scanning processing of the substrate W by the nozzle 7 will be described next with reference to FIG. 2. FIG. 2 is a plan view of the scanning processing of the substrate W by the nozzle 7. As illustrated in FIG. 2, the scanning processing by the nozzle 7 is processing by which the processing liquid is discharged to the target TG while the nozzle 7 is moved so that a liquid landing point of the processing liquid on the surface of the target TG draws an arc-shaped trajectory TJ1 in plan view. The trajectory TJ1 passes through an edge part EG and a center part CT of the substrate W. The center part CT is an area on the substrate W through which the rotation axis AX passes. The edge part EG is the periphery of the substrate W. The scanning processing of the substrate W by the nozzle 7 is performed during rotation of the substrate W. During the scanning processing of the substrate W by the nozzle 7, the moving speed of the nozzle 7 is constant. The moving speed of the nozzle 7 is represented by an angular velocity or a velocity of the nozzle 7 when the nozzle 7 moves, for example.

Specifically, the nozzle 7 turns in a rotational direction RT1 that is a clockwise direction and turns in a rotational direction RT2 that is an anticlockwise direction. That is, the nozzle 7 turns in the rotational direction RT1, turns back at a turning point TR1, and turns in the rotational direction RT2. The nozzle 7 then turns buck at a turning point TR2, and turns in the rotational direction RT1. That is, the nozzle 7 repeats movement between the turning point TR1 and the turning point TR2. The turning point TR1 is a turning point of the nozzle 7 in the rotational direction RT1. The turning point TR2 is a turning point of the nozzle 7 in the rotational direction RT2. The center part CT is located between the turning point TR1 and the turning point TR2 on the trajectory TJ1 in plain view. The turning point TR1 and the turning point TR2 are appropriately changed according to a processing condition of the processing liquid. Note that a turning point TR3 will be described later.

Figure 3:
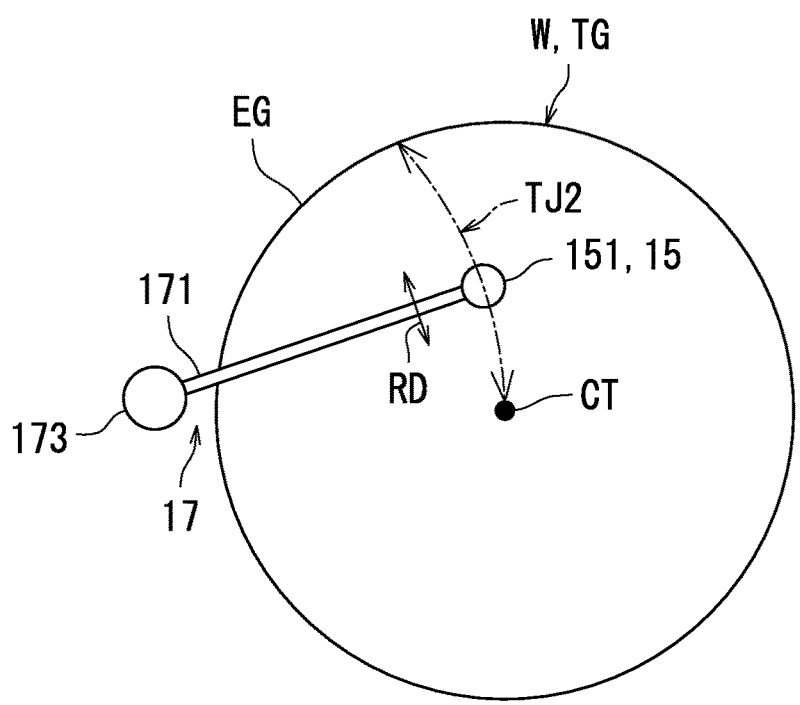
FIG. 3 is a plan view of scanning processing on the substrate using an optical probe of the substrate processing apparatus according to the embodiment.

Description of scanning processing of the substrate W by the optical probe 151 will be made next with reference to FIG. 3. FIG. 3 is a plan view of the scan processing of the substrate W by the optical probe 151. As illustrated in FIG. 3, the scanning processing by the optical probe 151 is processing by which the thickness of the target TG is measured while the optical probe 151 is moved so that the measurement points at which the thickness of the target TG is measured present an arc-shaped trajectory TJ2 in plan view. The trajectory TJ2 passes through the edge part EG and the center part CT of the substrate W. The scanning processing of the substrate W by the optical probe 151 is performed during rotation of the substrate W.

Specifically, the optical probe 151 moves along the measurement points while moving between the center part CT and the edge part EG of the substrate W in plan view. In other words, the thickness measuring section 15 measures the thickness of the target TG at each of the measurement points on the target TG. As a result, a thickness distribution of the target TG from the center part CT to the edge part EG of the substrate W is measured. That is, a thickness distribution of the target TG in a radial direction RD of the substrate W is measured.

Figure 4A:
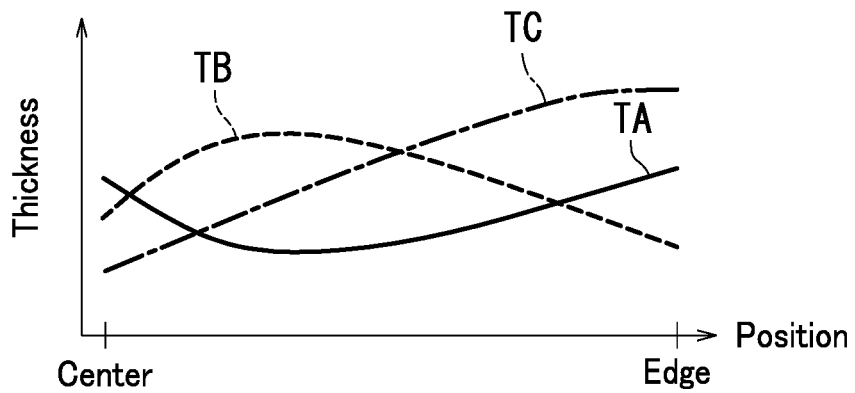
FIG. 4A is a diagram illustrating thickness patterns before etching by the substrate processing apparatus according to the embodiment.
Figure 4B:
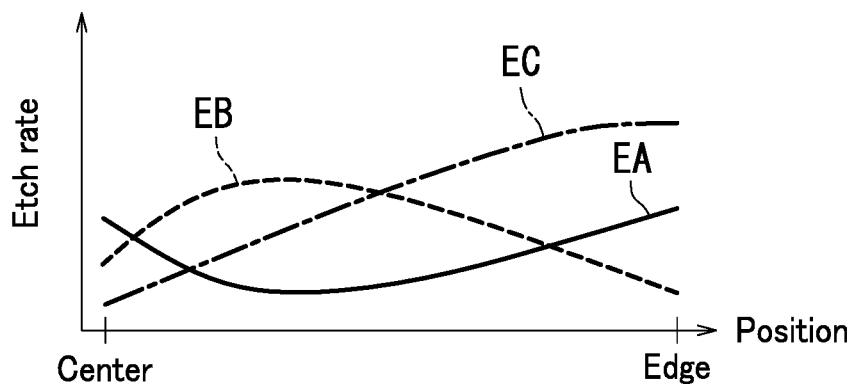
FIG. 4B is a diagram illustrating etch rate distributions resulted by the substrate processing apparatus according to the embodiment.
Figure 4C:
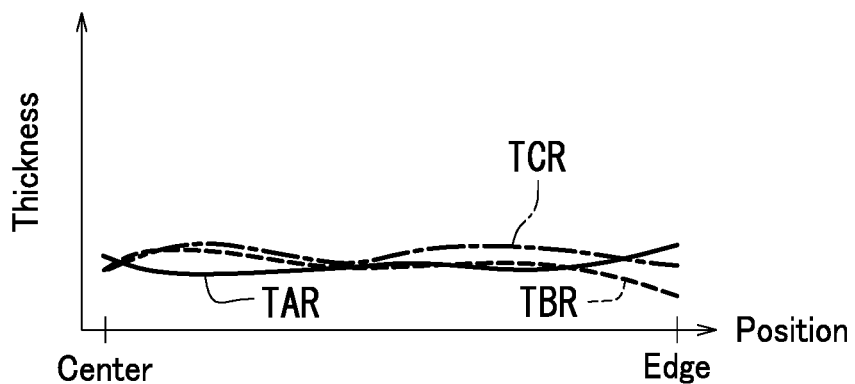
FIG. 4C is a diagram illustrating thickness patterns after etching by the substrate processing apparatus according to the embodiment.

Etching processing of the substrate W (specifically, the target TG) by the substrate processing apparatus 100 will be described next with reference to FIGS. 4A to 4C. FIG. 4A is a diagram illustrating thickness patterns TA, TB, and TC before etching. FIG. 4B is a diagram illustrating etch rate distributions EA, EB, and EC. FIG. 4C is a diagram illustrating thickness patterns TAR, TBR, and TCR after etching. Each "thickness pattern" represents a distribution of thicknesses measured at the respective measurement points on the target TG. That is, the "thickness pattern" represents a thickness distribution of the target TG in the radial direction RD of the substrate W.

In each of FIGS. 4A to 4C, the horizontal axis indicates position on the substrate W. In each of FIGS. 4A and 4C, the vertical axis indicates thickness of the target TG. In FIG. 4B, the vertical axis indicates etch rate of the target TG. The etch rate is an etching amount per unit time.

In a case in which the target TG before being etched has the thickness pattern TA as illustrated in FIG. 4(*a*), a processing condition is determined so that the etch rate distribution EA having a high correlation with the thickness pattern TA is exhibited as illustrated in FIG. 4B, and then the etching processing is performed. As a result, according to present embodiment, in a case in which the target TG before being etched has the thickness pattern TA, the target TG after being etched has the thickness pattern TAR that is substantially flat as illustrated in FIG. 4C. In other words, the range of thickness variation of the target TG after being etched can be reduced across a wide range (a range from the center part CT to the edge part EG) of the target TG.

Similarly, a processing condition is determined so that the etch rate distribution EB having a high correlation with the thickness pattern TB of the target TG before being etched is exhibited as illustrated in FIGS. 4A and 4B, and then the etching processing is performed. As a result, in a case in which the target TG has the thickness pattern TB before the etching processing, the target TG after being etched has the thickness pattern TBR that is substantially flat as illustrated in FIG. 4C.

Similarly, a processing condition is determined so that the etch rate distribution EC having a high correlation with the thickness pattern TC of the target TG before being etched is exhibited as illustrated in FIGS. 4A and 4B, and then the etching processing is performed. As a result, in a case in which the target TG before being etched has the thickness pattern TC, the target TG after the etching processing has the thickness pattern TCR that is substantially flat as illustrated in FIG. 4C.

Note that in a case in which a processing condition for substantially leveling the etch rate distribution is determined on the assumption that a target has a thickness substantially even in the radial direction thereof (i.e., the thickness pattern of the target is substantially flat), the thickness pattern of the target after being etched will not be substantially flat if the thickness of the target is uneven in the radial direction thereof, resulting in the possibility of thickness variation being caused in the target after being etched.

Figure 5:
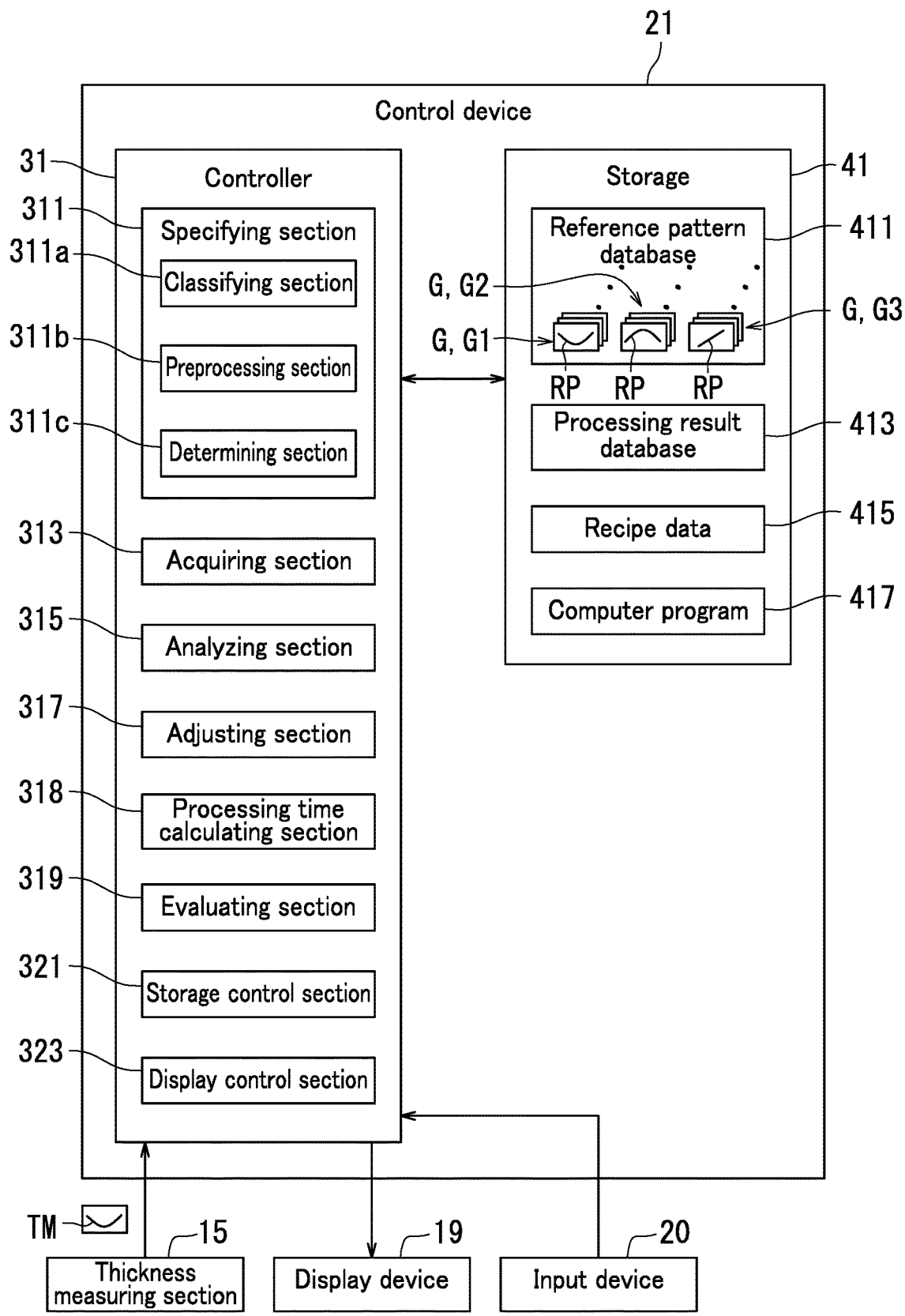
FIG. 5 is a block diagram of a control device of the substrate processing apparatus according to the embodiment.

The control device 21 will be described next with reference to FIG. 5. FIG. 5 is a block diagram of the control device 21. As illustrated in FIG. 5, the control device 21 includes a controller 31 and storage 41. The controller 31 controls the storage 41. The controller 31 also controls any other constituent elements of the substrate processing apparatus 100.

The controller 31 includes a processor such as a central processing unit (CPU). The storage 41 includes a storage device and stores data and computer programs therein. Specifically, the storage 41 includes a main storage device such as semiconductor memory and an auxiliary storage device such as semiconductor memory and/or a hard disk drive. The storage 41 may include a removable medium such as an optical disk. The processor of the controller 31 executes the computer programs stored in the storage device of the storage 41 to control each constituent element of the substrate processing apparatus 100. The storage 41 is equivalent to an example of a "storage medium". The "storage medium" is a non-transitory computer-readable recording medium, for example.

Specifically, the storage 41 stores recipe data 415 and a computer program 417 therein. The storage 41 further includes a reference pattern database 411. Preferably, the storage 41 includes a processing result database 413.

The reference pattern database 411 stores a plurality of reference patterns RP therein. The reference patterns RP each are pre-classified into any of a plurality of reference groups G. The reference groups G are defined based on shape characteristics of the reference patterns RP. The reference pattern database 411 also stores a plurality of reference processing conditions therein. The reference processing conditions are associated with the respective reference patterns RP.

The processing result database 413 stores therein information indicating a result of processing of the target TG with the processing liquid. The recipe data 415 contains information indicating a plurality of recipes. The recipes each define processing contents and processing procedure for the substrate W. The computer program 417 causes the processor of the controller 31 to execute a substrate processing method including a processing condition selection method according to the present embodiment. For example, the computer program 417 operates the processor of the controller 31 to select a processing condition usable in processing the target TG constituting the substrate W with the processing liquid from among the reference processing conditions. The processor is equivalent to an example of a "computer".

The controller 31 includes a specifying section 311 and an acquiring section 313. The processor of the controller 31 executes the computer program 417 to function as the specifying section 311 and the acquiring section 313.

The specifying section 311 acquires from the thickness measuring section 15 information indicating the thickness of the target TG measured by the thickness measuring section 15 before processing with the processing liquid. The information indicating the thickness of the target TG contains a thickness pattern of the target TG before being processed with the processing liquid (also referred to below as "thickness pattern TM").

The specifying section 311 compares the thickness pattern TM to each of the reference patterns RP pre-stored in the storage 41 (specifically, the reference pattern database 411). The specifying section 311 specifies a reference pattern RP having a high correlation with the thickness pattern TM from among the reference patterns RP based on a prescriptive rule (also referred to below as "prescriptive rule RU"). In other words, the "reference pattern RP having a high correlation with the thickness pattern TM" in the present embodiment is a "reference pattern RP with a shape (profile) analogous to a shape (profile) of the thickness pattern TM", for example.

For example, the specifying section 311 specifies from among the reference patterns RP a reference pattern RP having the highest correlation with the thickness pattern TM based on the prescriptive rule RU. In other words, the "reference pattern RP having the highest correlation with the thickness pattern TM" in the present specification is a "reference pattern RP with a shape (profile) the most analogous to the shape (profile) of the thickness pattern TM", for example.

A criterion for a high correlation is defined in the prescriptive rule RU. The criterion for a high correlation is defined experimentally and empirically. For example, a correlation being high means that one or more characteristics match or are analogous between the thickness pattern TM and a reference pattern RP.

When there are a plurality of reference patterns RP having the highest correlation with the thickness pattern TM, the specifying section 311 selects a new reference pattern RP registered the most recently in the reference pattern database 411. The specifying section 311 then specifies the selected reference pattern RP as a "reference pattern RP having a high correlation with the thickness pattern TM".

Information indicating the prescriptive rule RU is stored in the storage 41, for example. The storage 41 may store a plurality of prescriptive rules RU. In this case, a user is allowed to select a prescriptive rule RU according to the situation from among the prescriptive rules RU through the input device 20. The specifying section 311 then specifies a reference pattern RP having a high correlation with the thickness pattern TM by comparison based on the prescriptive rule RU selected by the user.

Furthermore, a search engine may be used in which the prescriptive rules RU are embedded or that is capable of reading the prescriptive rules RU. The search engine specifies a reference pattern RP having a high correlation with the thickness pattern TM by comparison through search using the thickness pattern TM as input information.

The reference patterns RP represent physical quantity distributions of respective reference targets. The reference targets each are a target constituting a substrate previously processed. The reference targets each are a substrate body previously processed, for example. Alternatively, the reference targets each are a substance formed on the surface of a substrate body and previously processed, for example. The substance formed on the surface of the substrate body is a substance of the same material as that of the substrate body or a material different from that of the substrate body, for example. The "substance" may form a film.

The raw material and composition of the "substrate previously processed" are the same as the raw material and composition of the substrate W including the target TG. Furthermore, the raw material and composition of each "reference target" are the same as the raw material and composition of the target TG.

The acquiring section 313 acquires as a processing condition for the target TG a reference processing condition associated with the reference pattern RP specified by the specifying section 311 among the reference processing conditions associated with the respective reference patterns RP from the storage 41 (specifically, the reference pattern database 411). That is, the acquiring section 313 determines the acquired reference processing condition to be a processing condition. The "processing condition" is a processing condition usable in processing the target TG with the processing liquid.

Each of the reference processing conditions is a processing condition when processing with the processing liquid is previously performed on a reference target having a reference pattern RP with which the reference processing condition is associated. In this case, the "processing liquid" is the same as the processing liquid in processing the target TG.

As described above with reference to FIG. 5, a reference processing condition associated with the reference pattern RP having a high correlation with the thickness pattern TM of the target TG is acquired as a processing condition for the target TG in the present embodiment. That is, a reference processing condition associated with the reference pattern RP having a high correlation with the thickness pattern TM of the target TG is selected as a processing condition for the target TG from among the reference processing conditions. Accordingly, the range of thickness variation of the target TG after being processed can be reduced across a wide range of the target TG constituting the substrate W by processing the target TG under the selected processing condition. The "wide range" in the present embodiment refers to a range from the center part CT to the edge part EG of the substrate W.

In particular, the processing liquid in the present embodiment is an etching liquid used for etching the target TG. In this case, the "physical quantity" of a "physical quantity distribution of a reference target" that defines a reference pattern RP is an etch rate. That is, each reference pattern RP represents an etch rate distribution of the reference target.

As such, a reference pattern RP is selected that represents an etch rate distribution having a high correlation with the thickness pattern TM of the target TG. A reference processing condition associated with the reference pattern RP that represents such an etch rate distribution is acquired as a processing condition for the target TG. Therefore, the range of thickness variation of the target TG after being etched can be reduced across the wide range of the target TG by etching the target TG under the acquired processing condition. That is, a thickness pattern of the target TG after being etched (also referred to below as "thickness pattern TMR") can be substantially flat across the wide range of the target TG.

Referring to FIGS. 4A to 4C as examples, each of the thickness patterns TA to TC before the etching processing illustrated in FIG. 4A corresponds to the thickness pattern TM before the etching processing. Also, each of the etch rate distributions EA to EC illustrated in FIG. 4B corresponds to a reference pattern RP that represents an etch rate distribution having a high correlation with the thickness pattern TM. Further, each of the thickness patterns TAR to TCR after the etching processing illustrated in FIG. 4C corresponds to the thickness pattern TMR after being etched.

Note that the "physical quantity" of a "physical quantity distribution of a reference target" that defines a reference pattern RP may be an etching amount. That is, the reference pattern RP may represent an etching amount distribution of the reference target.

Furthermore, in the present embodiment, each of the reference processing conditions contains information indicating a rotational speed of a substrate including a corresponding one of the reference targets, information indicating the turning points of the nozzle 7 that discharges the processing liquid to the reference target, and information indicating a moving speed of the nozzle 7 along the reference target. As such, the rotational speed of the substrate W in processing, the turning points of the nozzle 7 that discharges the processing liquid to the target TG, and the moving speed of the nozzle 7 along the target TG can be appropriately determined according to the thickness pattern TM of the target TG through acquisition of a reference processing condition associated with the reference pattern RP having a high correlation with the thickness pattern TM of the target TG as a processing condition for the target TG. As a result, the range of thickness variation of the target TG after being processed can be further reduced across the wide range of the target TG. Specifically, the range of the thickness variation of the target TG after being etched can be further reduced across the wide range of the target TG.

The specifying section 311 of the controller 31 will be further described with reference to FIG. 5. As illustrated in FIG. 5, the specifying section 311 preferably includes a classifying section 311a and a determining section 311c.

The classifying section 311a classifies the thickness pattern TM of the target TG before being etched into any one of the reference groups G. The determining section 311c then determines a reference pattern RP having a high correlation with the thickness pattern TM by comparison of the thickness pattern TM to each of two or more reference patterns RP based on the prescriptive rule RU. Here, the two or more reference patterns RP each are a reference pattern RP classified into a reference group G into which the thickness pattern TM of the target TG is classified. As such, according to the present embodiment, a reference pattern RP having a high correlation with the thickness pattern TM can be determined within a shorter period of time than a case in which a reference pattern RP having a high correlation with the thickness pattern TM is specified by comparison of the thickness pattern TM to each of all of the reference patterns RP. The "reference pattern RP determined by the determining section 311c" corresponds to the "reference pattern RP specified by the specifying section 311".

For example, the determining section 311c determines a reference pattern RP having the highest correlation with the thickness pattern TM among the two or more reference patterns RP of the reference patterns RP classified into the reference group G into which the thickness pattern TM of the target TG is classified.

When there are a plurality of reference patterns RP having the highest correlation with the thickness pattern TM, the determining section 311c selects a reference pattern RP registered the most recently in the reference pattern database 411. The determining section 311c then determines the selected reference pattern RP to be a "reference pattern RP having a high correlation with the thickness pattern TM".

A prescriptive rule RU is defined for each of the reference groups G. Information indicating the prescriptive rule RU is stored for example in the storage 41 for each reference group G. The storage 41 may store therein a plurality of prescriptive rules RU for each reference group G. In this case, the user is allowed to select according to the reference group G a prescriptive rule RU suitable for the situation from among the prescriptive rules RU through the input device 20. The determining section 311c then determines a reference pattern RP having a high correlation with the thickness pattern TM by comparison based on the prescriptive rule RU selected by the user.

Furthermore, a search engine may be used in which the prescriptive rules RU are embedded or that is capable of reading the prescriptive rules RU. The search engine determines a reference pattern RP having a high correlation with the thickness pattern TM by comparing through search the thickness pattern TM as input information to each of two or more reference patterns RP classified into a reference group G into which the thickness pattern TM is classified.

The acquiring section 313 acquires from the storage 41 (specifically, the reference pattern database 411) a reference processing condition associated with the reference pattern RP determined by the determining section 311c as a processing condition for the target TG.

Preferably, the specifying section 311 further includes a preprocessing section 311b. The preprocessing section 311b makes the dimension ([length L]) of the thickness pattern TM of the target TG and the dimension ([length L]/[time T]) of the reference pattern RP the same as each other.

For example, the preprocessing section 311b converts the dimension of the reference patterns RP to the dimension of the thickness pattern TM. In this case, specifically, the preprocessing section 311b calculates a conversion coefficient CV. The preprocessing section 311b then converts the dimension of each of the reference patterns RP included in the reference group G into which the thickness pattern TM is classified to the dimension of the thickness pattern TM by multiplying the reference pattern RP by the conversion coefficient CV.

The conversion coefficient CV is calculated by dividing an average value AV1 by an average value AV2. The average value AV1 is an average value of a plurality of thickness values constituting the thickness pattern TM. The average value AV2 is an average value of a plurality of etch rates constituting the reference patterns RP included in the reference group G into which the thickness pattern TM is classified.

For example, the preprocessing section 311b may convert the dimension of a thickness pattern TM to the dimension of a reference pattern RP. For example, the preprocessing section 311b may render the thickness pattern TM and the reference patterns RP dimensionless through standardization or normalization of the thickness pattern TM and the reference patterns RP.

After the dimension of the thickness pattern TM and the dimension of the reference patterns RP are made the same as each other by the preprocessing section 311b, the determining section 311c determines a reference pattern RP having a high correlation with the thickness pattern TM (i.e., a reference pattern RP analogous to the thickness pattern TM) based on the prescriptive rule RU from among the reference patterns RP included in the reference group G into which the thickness pattern TM is classified. Therefore, according to the present embodiment, a reference pattern RP having a high correlation with the thickness pattern TM (i.e., a reference pattern analogous to the thickness pattern TM) can be determined with further high accuracy.

The reference groups G will be described next with reference to FIGS. 5 to 9B. As illustrated in FIG. 5, the reference groups G include at least one of a first reference group G1, a second reference group G2, and a third reference group G3. In the present embodiment, the reference groups G include the first reference group G1, the second reference group G2, and the third reference group G3. As such, the classifying section 311a classifies the thickness pattern TM of the target TG before being etched into any of the first to third reference groups G1 to G3.

By contrast, each of the reference patterns RP is pre-classified into any of the first to third reference groups G1 to G3 in the present embodiment. Once the dimension of the thickness pattern TM and the dimension of the reference patterns RP are made the same as each other by the preprocessing section 311b, the determining section 311c determines based on the prescriptive rule RU a reference pattern RP having a high correlation with the thickness pattern TM (i.e., a reference pattern RP analogous to the thickness pattern TM) from among the two or more reference patterns RP classified into one reference group G of the first to third reference groups G1 to G3 into which the thickness pattern TM of the target TG is classified.

Figure 6A:
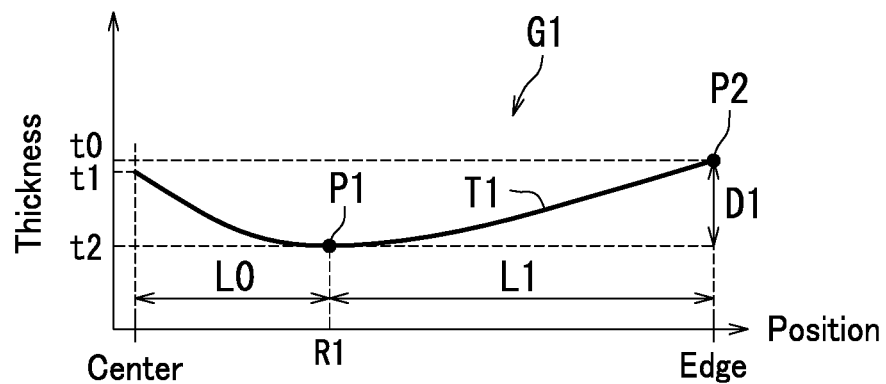
FIG. 6A is a diagram illustrating a thickness pattern classified into a first reference group in the embodiment.

FIG. 6A is a diagram illustrating a thickness pattern T1 classified into the first reference group G1. The horizontal axis indicates position on the substrate W while the vertical axis indicates thickness of the target TG. The classifying section 311a classifies the thickness pattern T1 of the target TG before being etched into the first reference group G1 as illustrated in FIG. 6A. The first reference group G1 is a group of patterns each having a minimum spot between the center part CT and the edge part EG of the target TG or a reference target (i.e., a pattern of a downwardly convex curve). A pattern such as above is an example of a "characteristic" of the thickness pattern T1 or a reference pattern RP1. The thickness pattern T1 has a minimum spot P1 of the thickness between the center part CT and the edge part EG.

Figure 6B:
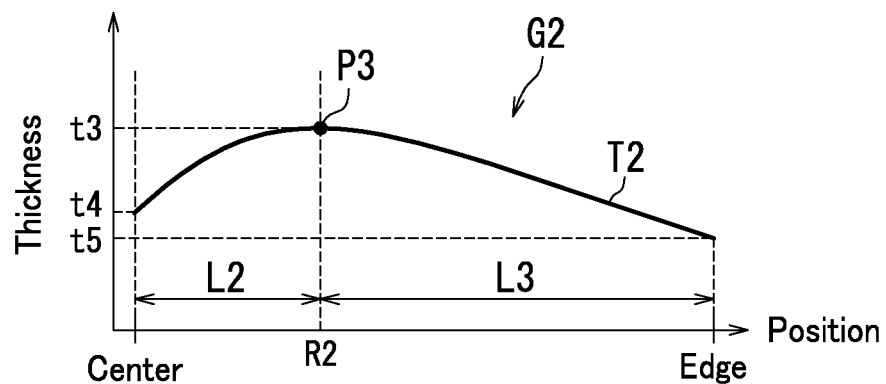
FIG. 6B is a diagram illustrating a thickness pattern classified into a second reference group in the embodiment.

FIG. 6B is a diagram illustrating a thickness pattern T2 classified into the second reference group G2. The horizontal axis indicates position on the substrate W while the vertical axis indicates thickness of the target TG. The classifying section 311a classifies the thickness pattern T2 of the target TG before being etched into the second reference group G2 as illustrated in FIG. 6B. The second reference group G2 is a group of patterns each having a maximum spot between the center part CT and the edge part EG of the target TG or a reference target (i.e., a pattern of an upwardly convex curve). A pattern such as above is an example of a "characteristic" of the thickness pattern T2 or a reference pattern RP2. The thickness pattern T2 has a maximum spot P3 of the thickness between the center part CT and the edge part EG.

Figure 6C:
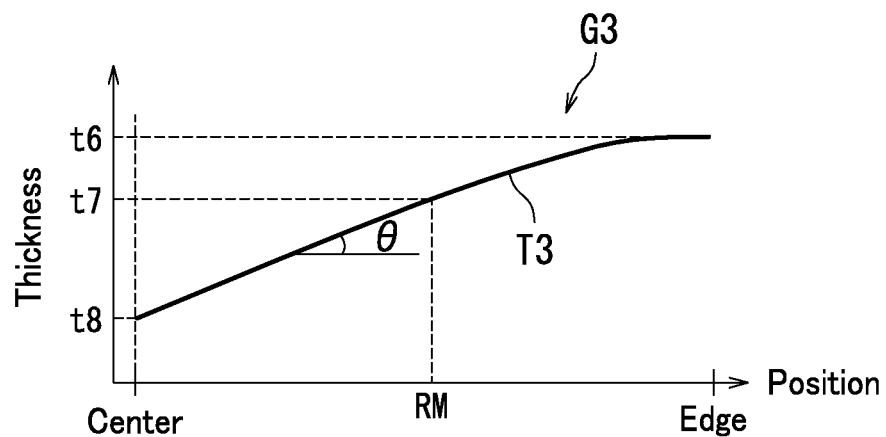
FIG. 6C is a diagram illustrating a thickness pattern classified into a third reference group in the embodiment.

FIG. 6C is a diagram illustrating a thickness pattern T3 classified into the third reference group G3. The horizontal axis indicates position on the substrate W while the vertical axis indicates thickness of the target TG. The classifying section 311a classifies the thickness pattern T3 of the target TG before being etched into the third reference group G3 as illustrated in FIG. 6C. The third reference group G3 is a group of patterns each inclining in one direction from the center part CT toward the edge part EG of the target TG or a reference target. In the present embodiment, the third reference group G3 is a group of a pattern inclining so as to increase toward the edge part EG from the center part CT of the target TG or a reference target. A pattern such as above is an example of a "characteristic" of the thickness pattern T3 or a reference pattern RP3. The thickness pattern T3 inclines so as to increase toward the edge part EG from the center part CT.

Figure 7A:
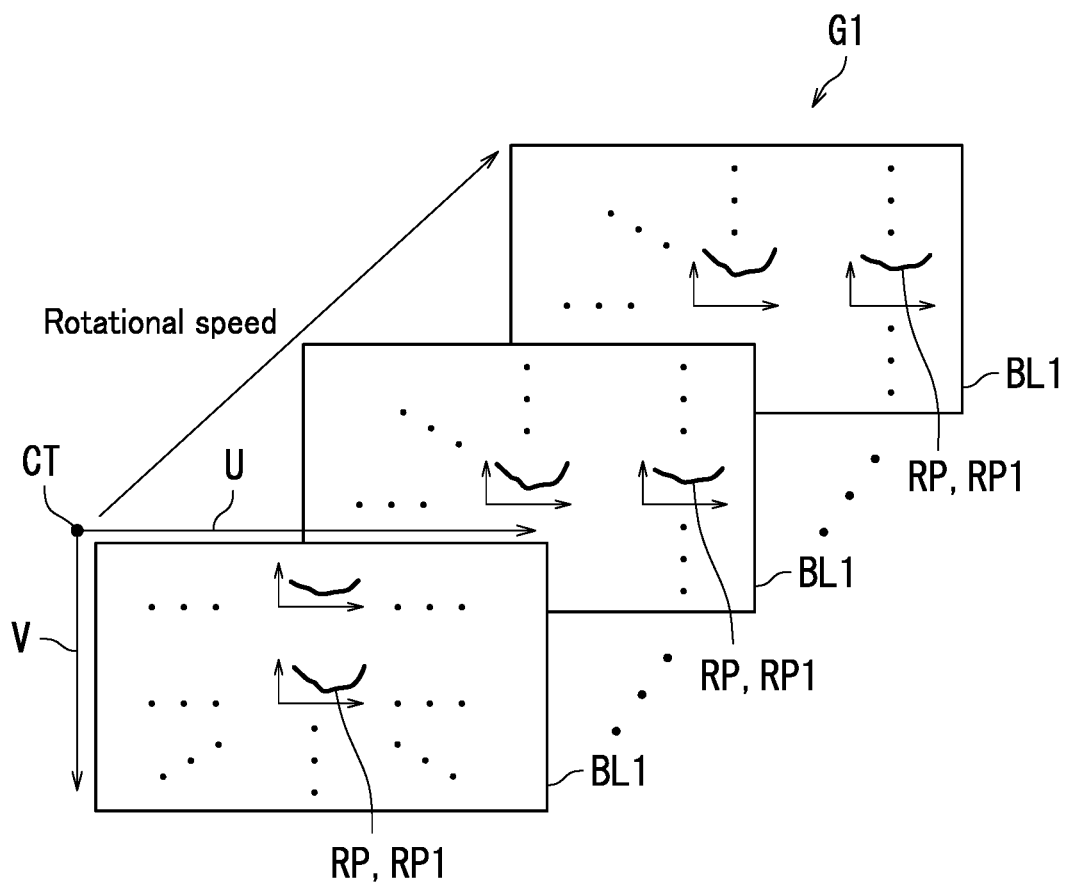
FIG. 7A is a diagram illustrating a plurality of reference patterns classified into the first reference group in the embodiment.

FIG. 7A is a diagram illustrating reference patterns RP1 classified into the first reference group G1. As illustrated in FIG. 7A, a plurality of tables BL1 belong to the first reference group G1. Each of the tables BL1 includes a plurality of mutually different reference patterns RP1.

Information items indicating mutually different rotational speeds are associated with the respective tables BL1. Information items indicating the same rotational speed are associated with the respective reference patterns RP1 included in a single table BL1. The "rotational speed" is a rotational speed of a substrate including a reference target, and is expressed for example in terms of a rotational speed of the substrate per unit time. The information items indicating the respective rotational speeds each are one of the reference processing conditions.

In each of the tables BL1, a U axis indicates the turning point TR1 of the nozzle 7 in the rotational direction RT1 (FIG. 2) while a V axis indicates the turning point TR2 of the nozzle 7 in the rotational direction RT2 (FIG. 2). Each of the turning point TR1 and the turning point TR2 indicates a position from the center part CT of the substrate.

One reference pattern RP1 is specified according to one turning point TR1 and one turning point TR2 in each of the tables BL1. That is, one turning point TR1 and one turning point TR2 are associated with one reference pattern RP1. Information indicating the turning point TR1 and information indicating the turning point TR2 each are one reference processing condition.

Furthermore, information items indicating the same moving speed are associated with the respective reference patterns RP1 included in the first reference group G1 (specifically, all the reference patterns RP1). The "moving speed" refers to a moving speed of the nozzle 7 along the reference target. Information items indicating respective moving speeds of the nozzle 7 each are one reference processing condition.

Figure 7B:
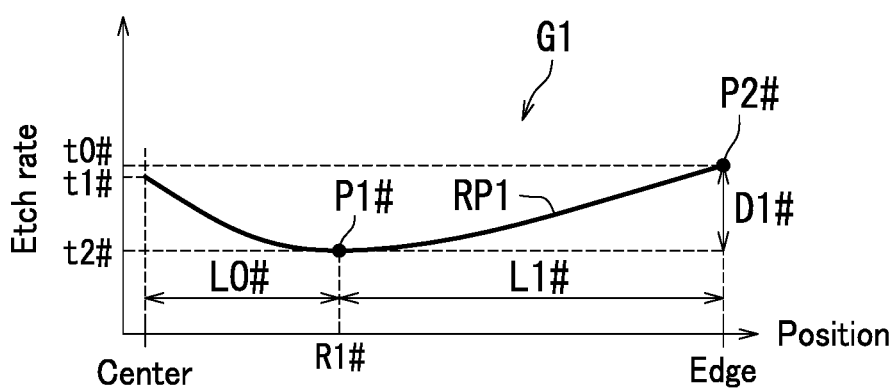
FIG. 7B is a diagram illustrating details of a reference pattern classified into the first reference group in the embodiment.

FIG. 7B is a diagram illustrating details of a reference pattern RP1. The horizontal axis indicates position on the substrate while the vertical axis indicates etch rate of a reference target. As illustrated in FIG. 7B, the reference pattern RP1 is classified into the first reference group G1. The reference pattern RP1 has a minimum spot P1 # of the etch rate between the center part CT and the edge part EG.

Figure 8A:
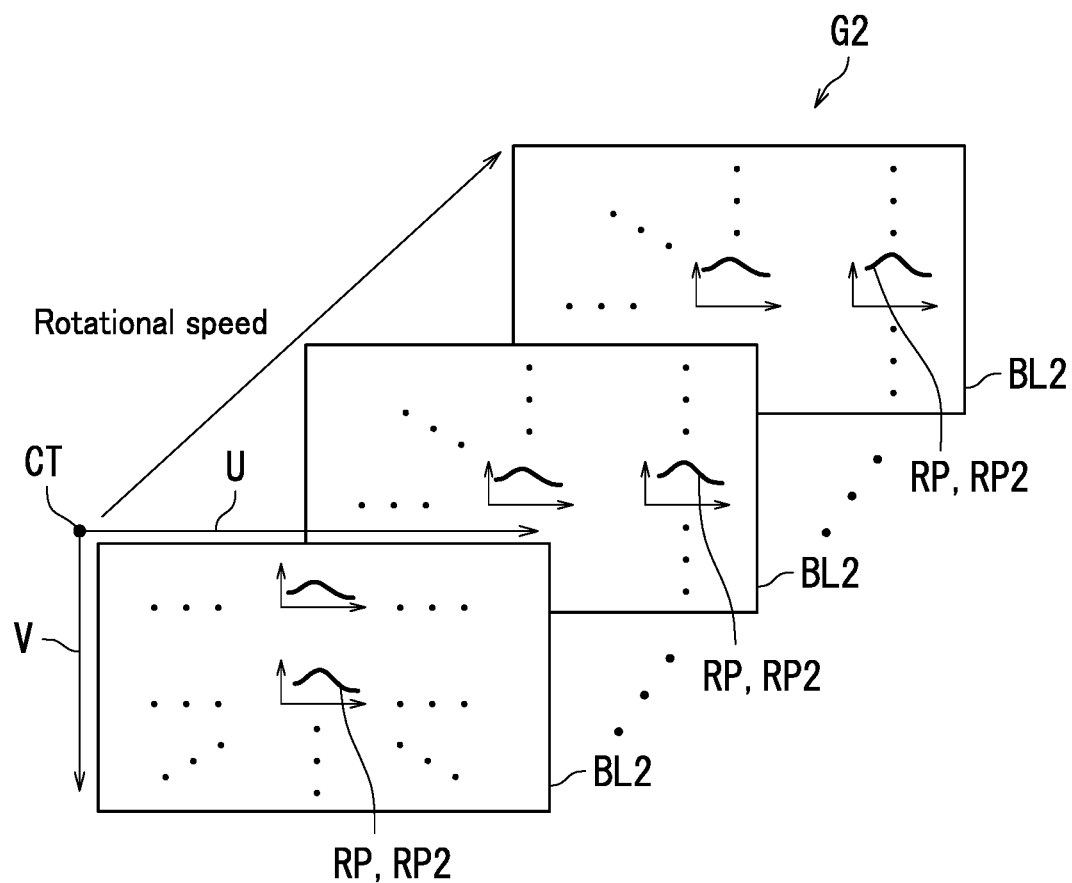
FIG. 8A is a diagram illustrating a plurality of reference patterns classified into the second reference group in the embodiment.

FIG. 8A is a diagram illustrating a plurality of reference patterns RP2 classified into the second reference group G2. As illustrated in FIG. 8A, a plurality of tables BL2 belong to the second reference group G2. Each of the tables BL2 includes a plurality of mutually different reference patterns RP2. The tables BL2 differ from the tables TB1 including the reference patterns RP1 (FIG. 7A) in that the tables BL2 each include the reference patterns RP2. However, the other aspects of the tables BL2 are the same as those of the tables BL1 and description thereof is omitted.

Figure 8B:
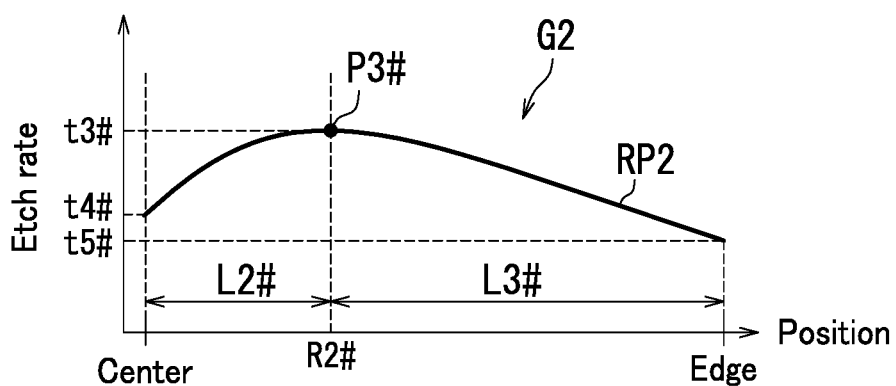
FIG. 8B is a diagram illustrating details of a reference pattern classified into the second reference group in the embodiment.

FIG. 8B is a diagram illustrating details of a reference pattern RP2. The horizontal axis indicates position on the substrate while the vertical axis indicates the etch rate of a reference target. As illustrated in FIG. 8B, the reference pattern RP2 is classified into the second reference group G2. The reference pattern RP2 has a maximum spot P3 # of the etch rate between the center part CT and the edge part EG.

Figure 9A:
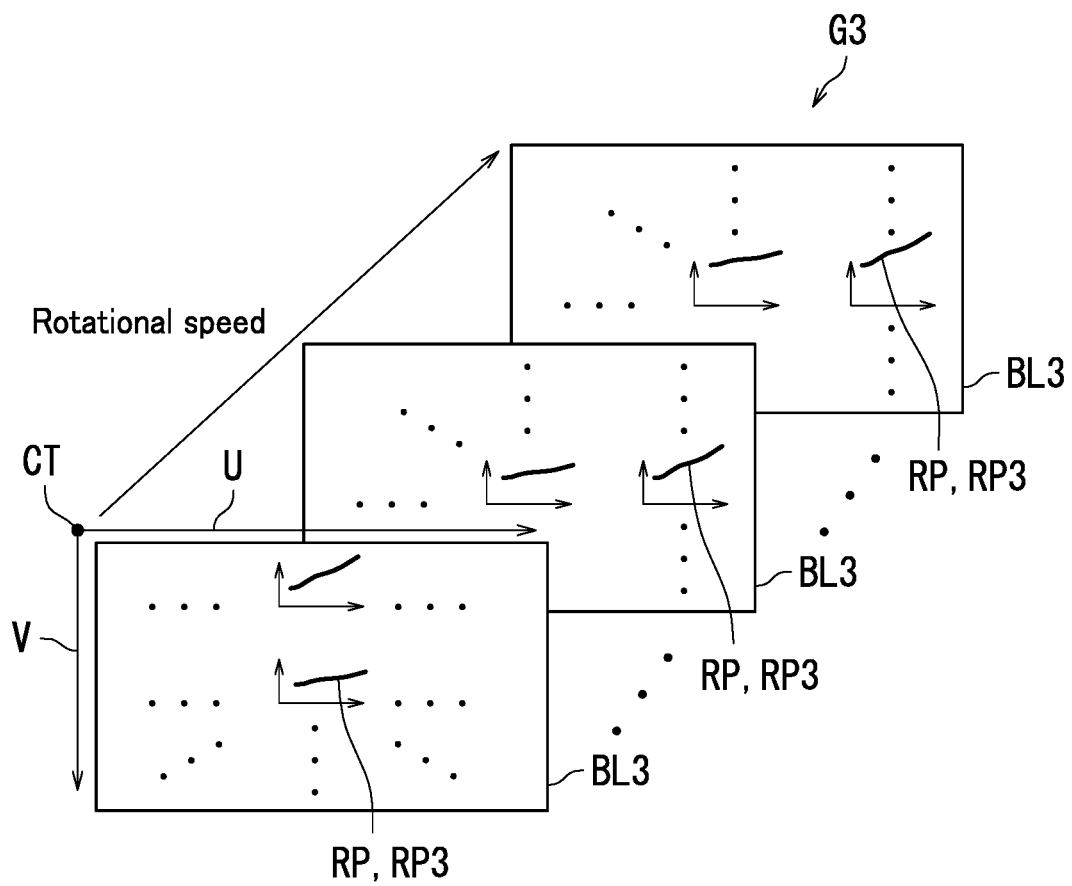
FIG. 9A is a diagram illustrating a plurality of reference patterns classified into the third reference group in the embodiment.

FIG. 9A is a diagram illustrating a plurality of reference patterns RP3 classified into the third reference group G3. As illustrated in FIG. 9A, a plurality of tables BL3 belong to the third reference group G3. Each of the tables BL3 includes a plurality of mutually different reference patterns RP3. The tables BL3 differ from the tables TB1 including the reference patterns RP1 (FIG. 7A) in that the tables BL3 include the reference patterns RP3. However, the other aspects of the tables BL3 are the same as those of the tables BL1 and description thereof is omitted.

Figure 9B:
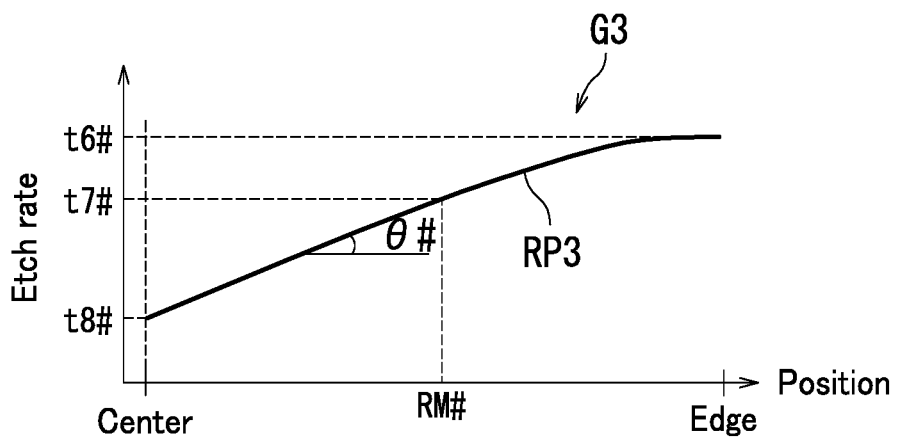
FIG. 9B is a diagram illustrating details of a reference pattern classified into the third reference group in the embodiment.

FIG. 9B is a diagram illustrating details of a reference pattern RP3. The horizontal axis indicates position on the substrate while the vertical axis indicates the etch rate of the reference target. As illustrated in FIG. 9B, the reference patterns RP3 are classified into the third reference group G3. In the reference patterns RP3, the etch rate inclines in one direction from the center part CT toward the edge part EG. Specifically, each of the reference patterns RP3 inclines such that the etch rate increases toward the edge part EG from the center part CT.

As described above with reference to FIGS. 5 to 9B, each of the first to third reference groups G1 to G3 is a group of patterns with a simple shape in the present embodiment. Therefore, the classifying section 311a can easily classify the thickness pattern TM.

Details of processing by the determining section 311c upon the thickness pattern T1 being classified into the first reference group G1 will be described next with reference to FIGS. 6A and 7B. In a case in which the reference group G into which the thickness pattern T1 is classified is the first reference group G1, the dimension of the thickness pattern T1 and the dimension of each of the reference patterns RP1 are made the same as each other. Then, the determining section 311c performs comparison of a first difference D1 based on the thickness pattern T1 to each of second differences D1 # based on the reference patterns RP1, and determines a reference pattern RP1 having a high correlation with the thickness pattern T1 (i.e., a reference pattern RP1 analogous to the thickness pattern T1) from among the reference patterns RP1 based on a result of the comparison. A determination rule such as above is an example of the prescriptive rule RU in the first reference group G1.

As illustrated in FIG. 6A, the first difference D1 is the absolute value of a difference between a thickness t2 and a thickness t0. Here, the thickness t2 is a thickness of the target TG indicated by the minimum spot P1 of the thickness pattern T1, and the thickness t0 is a thickness of the edge part EG of the target TG indicated by an edge part P2 of the thickness pattern T1.

As illustrated in FIG. 7B, the second difference D1 # is the absolute value of a difference between an etch rate t2 # and an etch rate t0 #. Here, the etch rate t2 # is an etch rate of the reference target indicated by the minimum spot P1 # of the reference pattern RP1, and the etch rate t0 # is an etch rate at the edge part EG of the reference target indicated by an edge part P2 # of the reference pattern RP1.

Because influence of the rotational speed of the substrate W is likely to appear in the etch rate at the edge part EG of the target TG, a further suitable processing condition (e.g., the rotational speed of the substrate W) for the target TG with the thickness pattern T1 can be acquired through determination of a reference pattern RP1 having a high correlation with the thickness pattern T1 based on a result of the comparison of the first difference D1 to the second difference D1 # in the present embodiment.

For example, the determining section 311c determines from among the reference patterns RP1 a reference pattern RP1 with the smallest absolute value of the difference between the first difference D1 and the second difference D1 # to be a reference pattern RP1 having a high correlation with the thickness pattern T1. For example, the determining section 311c determines from among the reference patterns RP1 a reference pattern RP1 with an absolute value of the difference between the first difference D1 and the second difference D1 # that is equal to or smaller than a predetermined value VA1 be a reference pattern RP1 having a high correlation with the thickness pattern T1. Determination rules in examples such as above are examples of the prescriptive rule RU in the first reference group G1.

Note that it is possible for the determining section 311c to perform comparison of information on at least one of the first difference D1, a distance L0, a distance L1, the thickness t0, a thickness t1, the thickness t2, and a difference (=t1−t2) illustrated in FIG. 6A to information on at least one of the second difference D1 #, a distance L0 #, a distance L1 #, the etch rate t0 #, an etch rate t1 #, the etch rate t2 #, and a difference (=t1 #−t2 #) illustrated in FIG. 7B, and determine a reference pattern RP1 having a high correlation with the thickness pattern T1 from among the reference patterns RP1 based on a result of the comparison. Determination rules such as above are examples of the prescriptive rule RU in the first reference group G1.

The distance L0 is a distance from the center part CT of the target TG to a point R1 corresponding to the minimum spot P1 of the thickness pattern T1. The distance L1 is a distance from the point R1 corresponding to the minimum spot P1 of the target TG to the edge part EG of the target TG. The thickness t0 is a thickness of the edge part EG of the target TG. The thickness t1 is a thickness of the center part CT of the target TG. The thickness t2 is a thickness of the target TG indicated by the minimum spot P1 of the thickness pattern T1.

The distance L0 # is a distance from the center part CT of the reference target to a point R1 # corresponding to the minimum spot P1 # of the reference pattern RP1. The distance L1 # is a distance from the point R1 # corresponding to the minimum spot P1 # of the reference target to the edge part EG of the reference target. The etch rate t0 # is an etch rate at the edge part EG of the reference target. The etch rate t1 # is an etch rate at the center part CT of the reference target. The etch rate t2 # is an etch rate of the reference target indicated by the minimum spot P1 # of the reference pattern RP1.

Note that the first difference D1, the distance L0, the distance L1, the thickness t0, the thickness t1, the thickness t2, and the difference (=t1−t2) each are an example of the "characteristic" of the thickness pattern T1. Also, the second difference D1 #, the distance L0 #, the distance L1 #, the etch rate t0 #, the etch rate t1 #, the etch rate t2 #, and the difference (=t1 #−t2 #) each are an example of the "characteristic" of the reference pattern RP1.

Details of processing by the determining section 311c upon the thickness pattern T2 being classified into the second reference group G2 will be described next with reference to FIGS. 6B and 8B. In a case in which the reference group G into which the thickness pattern T2 is classified is the second reference group G2, the dimension of the thickness pattern T2 and the dimension of the reference patterns RP2 are made the same as each other. Then, the determining section 311c performs comparison of a first distance L2 based on the thickness pattern T2 to each of second distances L2 # based on the reference patterns RP2, and determines a reference pattern RP2 having a high correlation with the thickness pattern T2 (i.e., a reference pattern RP2 analogous to the thickness pattern T2) from among the reference patterns RP2 based on a result of the comparison. A determination rule such as above is an example of the prescriptive rule RU in the second reference group G2.

As illustrated in FIG. 6B, the first distance L2 is a distance from the center part CT of the target TG to a point R2 corresponding to the maximum spot P3 of the thickness pattern T2.

As illustrated in FIG. 8B, the second distance L2 # is a distance from the center part CT of the reference target to a point R2 # corresponding to the maximum spot P3 # of the reference pattern RP2.

The etch rate at the target TG may be maximum at a turning point of the nozzle 7 in some cases. Therefore, in the present embodiment, a further suitable processing condition (e.g., a turning point of the nozzle 7) can be acquired for the target TG having the thickness pattern T2 through determination of a reference pattern RP2 having a high correlation with the thickness pattern T2 based on a result of the comparison of the first distance L2 to the second distance L2 #. A reason why the etch rate at the target TG is maximum at a turning point of the nozzle 7 is because a large amount of the processing liquid is discharged to the target TG at the turning point of the nozzle 7 due to stoppage of the nozzle 7 at the turning point of the nozzle 7. The above phenomenon is significant in a case in which the processing liquid is fluoro-nitric acid.

For example, the determining section 311c determines from among the reference patterns RP2 a reference pattern RP2 with the smallest absolute value of the difference between the first distance L2 and the second distance L2 # to be a reference pattern RP2 having a high correlation with the thickness pattern T2. For example, the determining section 311c determines from among the reference patterns RP2 a reference pattern RP21 with an absolute value of the difference between the first distance L2 and the second distance L2 # that is equal to or smaller than a predetermined value VA2 to be a reference pattern RP2 having a high correlation with the thickness pattern T2. Determination rules such as above each are an example of the prescriptive rule RU in the second reference group G2.

Note that it is possible for the determining section 311c to perform comparison of information on at least one of the first distance L2, a distance L3, a thickness t3, a thickness t4, a thickness t5, a difference (=t3−t5), and a difference (=t3−t4) illustrated in FIG. 6B to information on at least one of the second distance L2 #, a distance L3 #, an etch rate t3 #, an etch rate t4 #, an etch rate t5 #, a difference (=t3 #−t5 #), and a difference (=t3 #−t4 #) illustrated in FIG. 8B, and determine a reference pattern RP2 having a high correlation with the thickness pattern T2 from among the reference patterns RP2 based on a result of the comparison. A determination rule such as above is an example of the prescriptive rule RU in the second reference group G2.

The distance L3 is a distance from the point R2 corresponding to the maximum spot P3 of the thickness pattern T2 to the edge part EG of the target TG. The thickness t3 is a thickness of the target TG indicated by the maximum spot P3 of the thickness pattern T2. The thickness t4 is a thickness of the center part CT of the target TG. The thickness t5 is a thickness of the edge part EG of the target TG.

The distance L3 # is a distance from the point R2 # corresponding to the maximum spot P3 # of the reference pattern RP2 to the edge part EG of the reference target. The etch rate t3 # is an etch rate of the reference target indicated by the maximum spot P3 # of the reference pattern RP2. The etch rate t4 # is an etch rate at the center part CT of the reference target. The etch rate t5 # is an etch rate at the edge part EG of the reference target.

Note that the first distance L2, the distance L3, the thickness t3, the thickness t4, the thickness t5, the difference (=t3−t5), and the difference (=t3−t4) are examples of the "characteristic" of the thickness pattern T2. Also, the second distance L2 #, the distance L3 #, the etch rate t3 #, the etch rate t4 #, the etch rate t5 #, the difference (=t 3 #−t5 #), and the difference (=t3 #−t4 #) are examples of the "characteristic" of the reference pattern RP2.

Details of processing by the determining section 311c upon the thickness pattern T3 being classified into the third reference group G3 will be described next with reference to FIGS. 6C and 9B. In a case in which the reference group G into which the thickness pattern T3 is classified is the third reference group G3, the dimension of the thickness pattern T3 and the dimension of each of the reference patterns RP3 are made the same as each other. Then, the determining section 311c performs comparison of the inclination of the thickness pattern T3 to the inclination of each of the reference patterns RP3, and determines from among the reference patterns RP3 a reference pattern RP3 having a high correlation with the thickness pattern T3 (i.e., a reference pattern RP3 analogous to the thickness pattern T3) based on a result of the comparison. A determination rule such as above is an example of the prescriptive rule RU in the third reference group G3.

As illustrated in FIG. 6C, the inclination of the thickness pattern T3 is represented by an inclination angle θ, for example. The inclination angle θ is an inclination angle of the thickness pattern T3 relative to the radial direction of the substrate W including the target TG.

As illustrated in FIG. 9B, the inclination of the reference pattern RP3 is represented by an inclination angle θ#, for example. The inclination angle θ# is an inclination angle of the reference pattern RP3 relative to the radial direction of the substrate including the reference target.

The amount of the processing liquid provided to the edge part EG of the target TG may be larger than the amount the processing liquid provided to the center part CT thereof due to presence of centrifugal force in some cases. In view of the foregoing, in the present embodiment, a further suitable processing condition (e.g., a rotational speed of the substrate W) for the target TG with the thickness pattern T3 can be acquired through determination of a reference pattern RP3 having a high correlation with the thickness pattern T3 based on a result of the comparison of the inclination of the thickness pattern T3 to the inclination of each of the reference patterns RP3.

For example, the determining section 311c determines from among the reference patterns RP3 a reference pattern RP3 with the smallest absolute value of the difference between the inclination angle θ and the inclination angle θ# to be a reference pattern RP3 having a high correlation with the thickness pattern T3. For example, the determining section 311c determines from among the reference patterns RP3 a reference pattern RP3 with an absolute value of the difference between the inclination angle θ and the inclination angle θ# that is equal to or smaller than a predetermined value VA3 to be a reference pattern RP3 having a high correlation with the thickness pattern T3. Determination rules such as those in the above examples are examples of the prescriptive rule RU in the third reference group G3.

Note that it is possible for the determining section 311c to perform comparison of information on at least one of the inclination angle θ, a thickness t6, a thickness t8, and a difference (=t6−t8) illustrated in FIG. 6C to information on at least one of the inclination angle θ#, an etch rate t6 #, an etch rate t8 #, and a difference (=t6 #−t8 #) illustrated in FIG. 9B, and determine a reference pattern RP3 having a high correlation with the thickness pattern T3 from among the reference patterns RP3 based on a result of the comparison. A determination rule such as above is an example of the prescriptive rule RU in the third reference group G3.

The thickness t6 is a thickness of the edge part EG of the target TG. The thickness t8 is a thickness of the center part CT of the target TG.

The etch rate t6 # is an etch rate at the edge part EG of the reference target. The etch rate t8 # is an etch rate at the center part CT of the reference target.

Note that the inclination angle θ, the thickness t6, the thickness t8, and the difference (=t6−t8) each are an example of the "characteristic" of the thickness pattern T3. Also, the inclination angle θ#, the etch rate t6 #, the etch rate t8 #, and the difference (=t6 #−t8 #) each are an example of the "characteristic" of the reference pattern RP3.

The controller 31 will be described next with reference to FIGS. 5 to 9B. As illustrated in FIG. 5, it is preferable that the controller 31 further include an analyzing section 315 and an adjusting section 317. The analyzing section 315 analyzes the thickness pattern TM of the target TG to calculate a first characteristic quantity FT indicating a characteristic of the thickness pattern TM. The first characteristic quantity FT represents an extreme value of the thickness pattern TM, a thickness of the center part CT of the target TG indicated in the thickness pattern TM, or a thickness of the edge part EG of the target TG indicated in the thickness pattern TM. The extreme value of the thickness pattern TM is a maximum spot or a minimum spot of the thickness pattern TM.

Furthermore, the storage 41 pre-stores therein second characteristic quantities SC indicating characteristics of the respective reference patterns RP on a pattern-by-pattern basis. The second characteristic quantities SC each are an extreme value of a corresponding reference pattern RP, an etch rate at the center part CT of the reference target indicated in a corresponding reference pattern RP, or an etch rate at the edge part EG of the reference target indicated in a corresponding reference pattern RP.

The adjusting section 317 performs comparison of the first characteristic quantity FT indicating the characteristic of the thickness pattern TM to each of the second characteristic quantities SC indicating the characteristics of the respective reference patterns RP, and adjusts based on a result of the comparison information indicating the moving speed of the nozzle 7 included in the processing condition acquired by the acquiring section 313. As a result, the moving speed of the nozzle 7 is further preferable in the present embodiment, resulting in further reduction in the range of thickness variation of the target TG after being etching across the wide range of the target TG constituting the substrate W.

Specifically, in a case in which the thickness pattern T1 is classified into the first reference group G1 as illustrated in FIGS. 6A and 7B, the dimension of the thickness pattern T1 and the dimension of each of the reference patterns RP1 are made the same as each other. Then, the adjusting section 317 performs comparison of a thickness t2 to an etch rate t2 #, and adjusts information indicating the moving speed of the nozzle 7 included in the processing condition based on a result of the comparison. Here, the thickness t2 is indicated by the minimum spot P1 as the first characteristic quantity FT of the thickness pattern T1, and the etch rate t2 # is indicated by the minimum spot P1 # as the second characteristic quantity SC of the reference pattern RP1.

For example, when the thickness t2 of the target TG indicated by the minimum spot P1 is larger than the etch rate t2 # indicated by the minimum spot P1 # after the dimension of the thickness pattern T1 and the dimension of each of the reference patterns RP1 are made the same as each other, the adjusting section 317 reduces the moving speed of the nozzle 7 included in the processing condition by a value corresponding to the absolute value of a difference between the thickness t2 and the etch rate t2 #. This is because the etch rate increases as the moving speed of the nozzle 7 is reduced. By contrast, when the thickness t2 is smaller than the etch rate t2 #, the adjusting section 317 increases the moving speed of the nozzle 7 included in the processing condition by a value corresponding to the absolute value of the difference between the thickness t2 and the etch rate t2 #.

Furthermore, in a case in which the thickness pattern T2 is classified into the second reference group G2 as illustrated in FIGS. 6B and 8B, the dimension of the thickness pattern T2 and the dimension of each of the reference patterns RP2 are made the same as each other. Then, the adjusting section 317 performs comparison of a thickness t4 to an etch rate t4 #, and adjusts the information indicating the moving speed of the nozzle 7 included in the processing condition based on a result of the comparison. Here, the thickness t4 is a thickness of the center part CT of the target TG as the first characteristic quantity FT of the thickness pattern T2, and the etch rate t4 # is an etch rate at the center part CT of each reference target as the second characteristic quantity SC of each reference pattern RP2.

For example, when the thickness t4 of the center part CT of the target TG is larger than the etch rate t4 # at the center part CT of the reference target after the dimension of the thickness pattern T2 and the dimension of each of the reference patterns RP2 are made the same as each other, the adjusting section 317 reduces the moving speed of the nozzle 7 included in the processing condition by a value corresponding to the absolute value of a difference between the thickness t4 and the etch rate t4 #. This is because the etch rate increases as the moving speed of the nozzle 7 is reduced. By contrast, when the thickness t4 is smaller than the etch rate t4 #, the adjusting section 317 increases the moving speed of the nozzle 7 included in the processing condition by a value corresponding to the difference between the thickness t4 and the etch rate t4 #.

Furthermore, in a case in which the thickness pattern T3 is classified into the third reference group G3 as illustrated in FIGS. 6C and 9B, the dimension of the thickness pattern T3 and the dimension of each of the reference patterns RP3 are made the same as each other. Then, the adjusting section 317 performs comparison of a thickness t7 to an etch rate t7 #, and adjusts the information indicating the moving speed of the nozzle 7 included in the processing condition based on a result of the comparison. Here, the thickness t7 is a thickness of a mid-point RM of the target TG as the first characteristic quantity FT of the thickness pattern T3, and the etch rate t7 # is an etch rate at the mid-point RM of each reference target as the second characteristic quantity SC of a corresponding reference pattern RP3.

For example, when the thickness t7 of the mid-point RM of the target TG is larger than the etch rate t7 # at the mid-point RM of the reference target after the dimension of the thickness pattern T3 and the dimension of each of the reference patterns RP3 are made the same as each other, the adjusting section 317 reduces the moving speed of the nozzle 7 included in the processing condition by a value corresponding to the absolute value of a difference between the thickness t7 and the etch rate t7 #. This is because the etch rate increases as the moving speed of the nozzle 7 is reduced. By contrast, when the thickness t7 is smaller than the etch rate t7 #, the adjusting section 317 increases the moving speed of the nozzle 7 included in the processing condition by a value corresponding to the absolute value of the difference between the thickness t7 and the etch rate t7 #.

The controller 31 will be further described with further reference to FIG. 5. Preferably, the controller 31 further includes a processing time calculating section 318. The processing time calculating section 318 calculates an etching processing time based on an etching amount desired for the target TG and an average value of etch rates constituting a reference pattern RP associated with a processing condition acquired by the acquiring section 313.

Alternatively, the processing time calculating section 318 calculates an etching processing time based on an etching amount desired for the target TG and an etch rate based on a processing condition adjusted by the adjusting section 317.

In the present embodiment, the etching processing time is determined according to the number of times the nozzle 7 scans the substrate W.

Preferably, the controller 31 further includes a display control section 323. The display control section 323 controls the display device 19 to display information IN1 utilized for specifying or adjusting a reference pattern having a high correlation with the thickness pattern TM of the target TG before being processed with the processing liquid. As a result, the display device 19 displays the information IN1. Accordingly, the user can easily check or utilize the information IN1 in the present embodiment.

Examples of the information IN1 include the thickness pattern TM of the target TG, the characteristic quantity of the thickness pattern TM, the reference patterns RP, each characteristic quantity of the reference patterns RP, and the reference processing conditions.

Processing after processing of the substrate W with the processing liquid is described next with reference to FIG. 5. The thickness measuring section 15 measures the thickness of the target TG after being processed with the processing liquid at each of the measurement points on the target TG after being processed. Therefore, the user can know the thickness of the target TG after being processed, thereby enabling the user to evaluate etching processing on the target TG after processing.

Preferably, the controller 31 further includes a storage control section 321. The storage control section 321 controls the storage 41 (specifically, the processing result database 413) to store a thickness pattern TM before processing that represents a thickness distribution of the target TG before being processed, a reference pattern RP having a high correlation with the thickness pattern TM before being processed, a processing condition acquired by the acquiring section 313, and a thickness pattern TMR after processing that represents a thickness distribution of the target TG after being processed in association with each other. As such, the storage 41 stores the thickness pattern TM, the reference pattern RP having a high correlation with the thickness pattern TM, the processing condition, and the thickness pattern TMR in association with each other. As a result, the user can effectively utilize the information on these by accessing the storage 41 through the input device 20 in the present embodiment.

Preferably, the controller 31 further includes an evaluating section 319. The evaluating section 319 performs comparison of the thickness pattern TM before processing to the thickness pattern TMR after processing, and evaluates etching processing on the target TG after processing based on a result of the comparison.

Furthermore, the display control section 323 may control the display device 19 to display information IN2 that is utilized for evaluation of the thickness pattern TMR of the target TG after processing with the processing liquid. In this case, the display device 19 displays the information IN2. Accordingly, the user can evaluate etching processing on the target TG after processing by checking the information IN2 in the present embodiment. The input device 20 then receives input of information indicating a result of the evaluation from the user. The storage control section 321 further controls the storage 41 (specifically, the processing result database 413) to store the information indicating the result of the evaluation input by the user.

The information IN2 contains the processing condition acquired by the acquiring section 313, the thickness pattern TM of the target TG before being processed, the characteristic quantity of the thickness pattern TM, the reference pattern RP having a high correlation with the thickness pattern TM, the characteristic quantity of the reference pattern RP having a high correlation with the thickness pattern TM, the thickness pattern TMR of the target TG after being processed, and the characteristic quantity of the thickness pattern TMR, for example.

Alternatively, the storage control section 321 controls the storage 41 (specifically, the processing result database 413) to store a thickness pattern TM before processing that represents a thickness distribution of the target TG before being processed, a reference pattern RP having a high correlation with the thickness pattern TM before processing, a processing condition acquired by the acquiring section 313, a thickness pattern TMR after processing that represents a thickness distribution of the target TG after being processed, and a result of the evaluation for the thickness pattern TMR after processing in association with each other. As a result, the storage 41 stores the thickness pattern TM, the reference pattern RP having a high correlation with the thickness pattern TM, the processing condition, the thickness pattern TMR, and the result of the evaluation for the thickness pattern TMR in association with each other. Accordingly, the user can effectively utilize the information on these by accessing the storage 41 through the input device 20 in the present embodiment.

Note that the processor of the controller 31 executes the computer program 417 to function as the analyzing section 315, the adjusting section 317, the processing time calculating section 318, the evaluating section 319, the storage control section 321 and the display control section 323.

Figure 10:
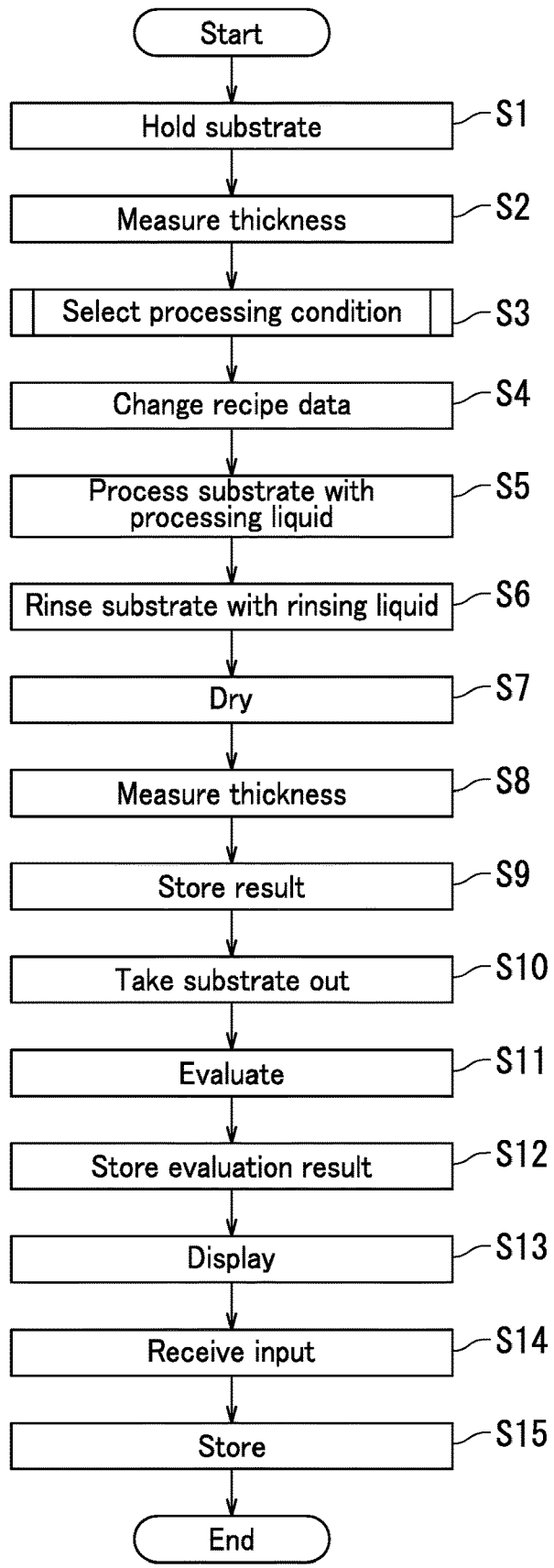
FIG. 10 is a flowchart depicting a substrate processing method according to the embodiment.

The following describes a substrate processing method according to the embodiment of the present invention with reference to FIGS. 5 and 10. FIG. 10 is a flowchart depicting the substrate processing method. As depicted in FIG. 10, the substrate processing method includes Steps S1 to S15. The substrate processing method is implemented by the substrate processing apparatus 100 for substrates W on a sheet-by-sheet basis.

As illustrated in FIGS. 5 to 10, the controller 31 of the substrate processing apparatus 100 controls the spin chuck 3 to hold the substrate W in Step S1. As a result, the spin chuck 3 holds the substrate W.

Next, in Step S2, the controller 31 controls the thickness measuring section 15 to measure the thickness of the target TG constituting the substrate W. As a result, the thickness measuring section 15 measures the thickness of the target TG before being processed and outputs information indicating the thickness pattern TM of the target TG before being processed to the controller 31.

Next, in Step S3, the controller 31 selects a processing condition usable in processing of the target TG constituting the substrate W with the processing liquid from among the reference processing conditions.

Subsequently, in Step S4, the controller 31 changes a "processing condition with the processing liquid (etching liquid)" included in the recipe data 415 to the processing condition selected in Step S3.

Next, in Step S5, the controller 31 controls the spin motor 5 and the nozzle moving section 9 so that the substrate W is processed with the processing liquid under the processing condition selected in Step S3. As a result, the substrate W is processed under the processing condition selected in Step S3. Specifically, the substrate W is rotated at a rotational speed included in the processing condition selected in Step S3. Furthermore, the nozzle 7 moves at a moving speed included in the processing condition selected in Step S3. In addition, the nozzle 7 turns at a turning point included in the processing condition selected in Step S3.

Next, in Step S6, the controller 31 controls the valve V2 so that the nozzle 11 discharges the rinsing liquid to the substrate W. As a result, the nozzle 11 discharges the rinsing liquid.

Subsequently, in Step S7, the controller 31 controls the spin motor 5 so that the substrate W rotates. As a result, the spin motor 5 rotates the spin chuck 3 to rotate the substrate W. Rotation of the substrate W dries the substrate W.

Next, in Step S8, the controller 31 controls the thickness measuring section 15 to measure the thickness of the target TG constituting the substrate W. As a result, the thickness measuring section 15 measures the thickness of the target TG after being processed and outputs information indicating the thickness pattern TMR of the target TG after being processed to the controller 31.

Subsequently, in Step S9, the storage control section 321 of the controller 31 controls the storage 41 to store the thickness pattern TM before processing that represents the thickness distribution of the target TG before being processed, a reference pattern RP having a high correlation with the thickness pattern TM before processing, the processing condition selected in Step S3, and the thickness pattern TMR after processing that represents the thickness distribution of the target TG after being processed in association with each other. As a result, the storage 41 (specifically, the processing result database 413) stores these information items.

Subsequently, in Step S10, the controller 31 controls a conveyor robot to take the substrate W out of the chamber 2. As a result, the conveyor robot takes the substrate W out of the chamber 2.

Next, in Step S11, the evaluating section 319 of the controller 31 performs comparison of the thickness pattern TM before processing to the thickness pattern TMR after processing, and evaluates etching processing on the target TG after processing based on a result of the comparison.

Subsequently, in Step S12, the storage control section 321 of the controller 31 controls the storage 41 to store the thickness pattern TM before processing that represents the thickness distribution of the target TG before being processed, the reference pattern RP having a high correlation with the thickness pattern TM before processing, the processing condition selected in Step S3, the thickness pattern TMR after processing that represents the thickness distribution of the target TG after being processed, and the result of the evaluation for the thickness pattern TMR after processing in association with each other. As a result, the storage 41 (specifically, the processing result database 413) stores these information items.

Next, in Step S13, the display control section 323 of the controller 31 controls the display device 19 to display the information stored in the reference pattern database 411 or the information stored in the processing result database 413. As a result, the display device 19 displays these information items.

Subsequently, in Step S14, the controller 31 receives user input through the input device 20. Specifically, the user inputs various information through the input device 20 while viewing the information displayed in Step S13. The controller 31 then receives the user input through the input device 20.

Next, in Step S15, the controller 31 controls the storage 41 to store information based on the received user input. As a result, the storage 41 stores information based on the received user input. The routine ends after Step S15.

In a substrate product production method according to the present embodiment, a substrate product that is the substrate W after processing is produced by processing the substrate W according to the substrate processing method including Steps S1 to S15.

Figure 11:
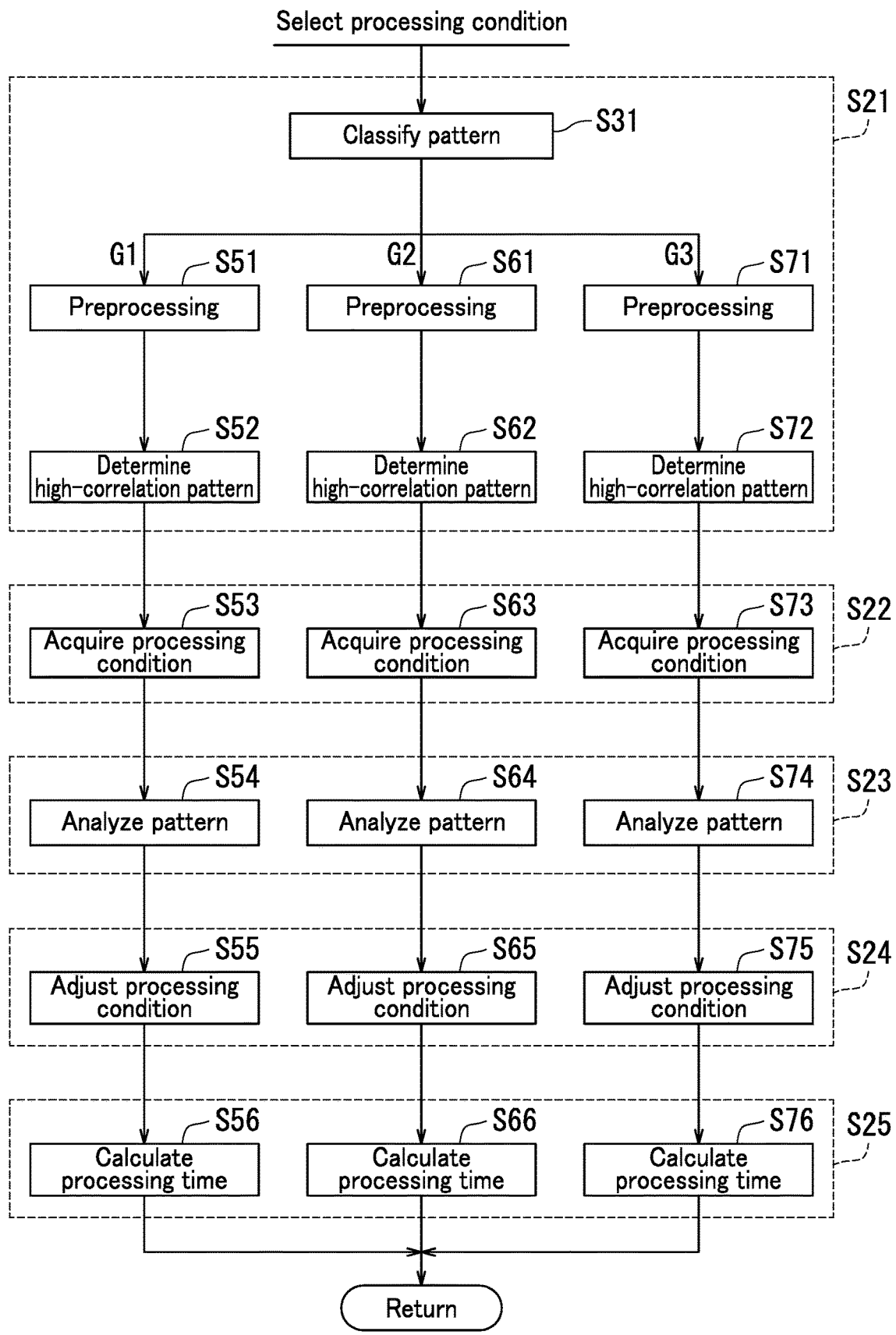
FIG. 11 is a flowchart depicting Step S3 in FIG. 10.

Step S3 in FIG. 10 will be described next with reference to FIGS. 5 and 11. FIG. 11 is a flowchart depicting Step S3 in FIG. 10. Step S3 includes Steps S21 to S25. Step S3 is equivalent to an example of a "processing condition selection method".

As illustrated in FIGS. 5 and 11, in Step S21, the specifying section 311 of the controller 31 performs comparison of the thickness pattern TM that represents a distribution of thicknesses measured at respective measurement points on the target TG to each of the reference patterns RP pre-stored the storage 41, and specifies from the reference patterns RP a reference pattern RP having a high correlation with the thickness pattern TM of the target TG based on the prescriptive rule RU.

Next, in Step S22, the acquiring section 313 acquires from the storage 41 a reference processing condition associated with the reference pattern RP specified in Step S21 as a processing condition from among the reference processing conditions associated with the respective reference patterns RP.

Next, in Step S23, the analyzing section 315 analyzes the thickness pattern TM of the target TG to calculate the first characteristic quantity FT indicating the characteristic of the thickness pattern TM.

Subsequently, in Step S24, the adjusting section 317 performs comparison of the first characteristic quantity FT indicating the characteristic of the thickness pattern TM to each of the second characteristic quantities SC indicating the characteristics of the reference patterns RP, and adjusts information indicating the moving speed of the nozzle 7 included in the processing condition acquired in the Step S22 based on a result of the comparison.

Next, in Step S25, the processing time calculating section 318 calculates an etch rate based on the processing condition adjusted in Step S24 and an etching processing time based on an etching amount desired for the target TG.

Specifically, Step S21 includes Step S31, Step S51, Step S52, Step S61, Step S62, Step S71, and Step S72. Also, Step S22 includes Step S53, Step S63, and Step S73. Step S23 includes Step S54, Step S64, and Step S74. Step S24 includes Step S55, Step S65, and Step S75. Step S25 includes Step S56, Step S66, and Step S76.

In Step S31, the classifying section 311a of the controller 31 classifies the thickness pattern TM of the target TG before being processed into any of the reference groups G. Specifically, the classifying section 311a classifies the thickness pattern TM into any of the first to third reference groups G1 to G3.

If the thickness pattern TM is classified into the first reference group G1 in Step S31, the routine proceeds to Step S51.

Next, in Step S51, the preprocessing section 311b makes the dimension of the thickness pattern TM and the dimension of each of the reference patterns RP1 the same as each other.

Subsequently, in Step S52, the determining section 311c determines, after the dimension of the thickness pattern TM and the dimension of each of the reference patterns RP1 are made the same as each other, a reference pattern RP1 having a high correlation with the thickness pattern TM (i.e., a reference pattern RP1 analogous to the thickness pattern TM) based on the prescriptive rule RU.

Next, in Step S53, the acquiring section 313 acquires from the storage 41 a reference processing condition associated with the reference pattern RP1 determined in Step S52 as a processing condition among the reference processing conditions associated with the respective reference patterns RP1.

Subsequently, in Step S54, the analyzing section 315 analyzes the thickness pattern TM classified into the first reference group G1 to calculate a first characteristic quantity FT indicating the characteristic of the thickness pattern TM.

Next, in Step S55, the adjusting section 317 performs comparison of the first characteristic quantity FT indicating the characteristic of the thickness pattern TM to each of the second characteristic quantities SC indicating the characteristics of the reference patterns RP1, and adjusts information indicating the moving speed of the nozzle 7 included in the processing condition acquired in the Step S53 based on a result of the comparison.

Subsequently, in Step S56, the processing time calculating section 318 calculates an etching processing time based on an etch rate based on the processing condition adjusted in Step S55 and an etching amount desired for the target TG. The routine then proceeds to Step S4 in FIG. 10.

If the thickness pattern TM is classified into the second reference group G2 by contrast in Step S31, the routine proceeds to Step S61. The processes in Steps S61 to S66 are respectively the same as Step S51 to S56 except for difference in the reference group G, and therefore description thereof is omitted.

If the thickness pattern TM is classified into the third reference group G3 in Step S31, the routine proceeds to Step S71. The processes in Steps S71 to S76 are respectively the same as Step S51 to S56 except for difference in the reference group G, and therefore description thereof is omitted.

Note that in Step S21, a reference pattern RP having a high correlation with the thickness pattern TM of the target TG before being processed may be specified based on a result of user input to the input device 20. Likewise, the processing condition may be adjusted based on a result of user input to the input device 20 in Step S24.

An embodiment of the present invention has been described so far with reference to the drawings. However, the present invention is not limited to the above-described embodiment and can be practiced in various ways within the scope without departing from the essence of the present invention. Furthermore, elements of configuration disclosed in the above embodiment may be altered as appropriate. For example, some of all the elements of configuration indicated in an embodiment may be added to elements of configuration in another embodiment. Alternatively or additionally, some of all the elements of configuration in an embodiment may be removed from the embodiment.

The drawings schematically illustrate main elements of configuration in order to facilitate understanding of the invention, and aspects of the elements of configuration illustrated in the drawings, such as thickness, length, number, and interval thereof, may differ from actual ones thereof in order to facilitate preparation of the drawings. Also, the configurations of elements of configuration described in the above embodiment are merely examples and not intended as specific limitations. It is needless to say that various alterations may be made within a scope not substantially departing from the effects of the present invention.

(1) The "physical quantity" of the "physical quantity distribution of a reference target" that defines a reference pattern RP is an etch rate in the embodiment described with reference to FIGS. 1 to 11, but may be the thickness of the reference target. That is, the reference pattern RP may represent a thickness distribution of the reference target.

In this case, a reference pattern RP that represents a thickness distribution having a high correlation with the thickness pattern TM of the target TG (i.e., a reference pattern RP that represents a thickness distribution analogous to the thickness pattern TM) is selected. A reference processing condition associated with the reference pattern RP that represents such a thickness distribution is acquired as a processing condition for the target TG. Therefore, etching processing of the target TG under the acquired processing condition can reduce the range of thickness variation of the target TG after being etched across the wide range of the target TG.

(2) An etching liquid has been described as an example of the processing liquid in the embodiment described with reference to FIGS. 1 to 11. However, the processing liquid is not limited to an etching liquid as long as the processing liquid is used for processing the substrate W. For example, the processing liquid may be a removal liquid for removing the target TG. In this case, the "physical quantity" of the "physical quantity distribution of a reference target" that defines a reference pattern RP is a removal rate or a removal amount of the reference target. As such, the reference pattern RP in this case represents a distribution of removal rates or removal amounts of the target TG.

The removal liquid is for example a mixed liquid of sulfuric acid and hydrogen peroxide (sulfuric acid/hydrogen peroxide mixture: SPM) when the substrate processing apparatus 100 performs processing for resist removal on the substrate W. The processing for resist removal is processing to remove a resist from the surface of a semiconductor substrate.

(3) The preprocessing section 311b makes the dimension of the thickness pattern TM of the target TG and the dimension of each of the reference patterns RP the same as each other after classification by the classifying section 311a and before determination by the determining section 311c in the embodiment described with reference to FIG. 5. However, it is possible that the storage 41 pre-stores a plurality of reference patterns RP rendered dimensionless through standardization or normalization. Then, the preprocessing section 311b may render the thickness pattern TM dimensionless through standardization or normalization before classification by the classifying section 311a.

(4) The specifying section 311 illustrated in FIG. 5 may specify two or more reference patterns RP having a high correlation with the thickness pattern TM from among the reference patterns RP. In this case, the acquiring section 313 may perform interpolation or extrapolation on two or more reference processing conditions associated with the respective two or more reference patterns RP to determine a processing condition.

(5) The specifying section 311 illustrated in FIG. 5 may specify a reference pattern RP having a high correlation with the thickness pattern TM after noise components are removed from the thickness pattern TM. In this case, a reference pattern RP having a high correlation with the thickness pattern TM can be specified further accurately.

(6) The measurement points on the target TG at which measurement by the thickness measuring section 15 illustrated in FIG. 5 is performed may be determined arbitrarily. For example, the thickness measurement points may be set at regular intervals. For example, the thickness measurement points may be located at intermediate points between the center part CT and the edge part EG of the target TG. The intermediate points are points between the center part CT and the edge part EG that are determined according to an etching characteristic. For example, it is possible that measurement intervals are set short in a specific area of the target TG while being set long in the other area thereof.

(7) In the embodiment described with reference to FIG. 2, the nozzle 7 turns at the turning point TR1 and the turning point TR2. However, the nozzle 7 may turn at the turning point TR1 on a side of the edge part EG and a turning point TR3 on a side of the center part CT. In this case, the reference processing conditions each include information on the turning point TR1 and information on the turning point TR3.

(8) Steps S23 to S25 in FIG. 11 may not be performed.

INDUSTRIAL APPLICABILITY

The present invention relates to a processing condition selection method, a substrate processing method, a substrate product production method, a processing condition selecting device, a computer program, and a storage medium, and has industrial applicability.

REFERENCE SINGS LIST

15 Thickness measuring section
41 Storage (storage medium)
100 Substrate processing apparatus (processing condition selecting device)

311 Specifying section
313 Acquiring section
417 Computer program
W Substrate

The invention claimed is:

1. A substrate processing method by which a processing condition usable in processing a target constituting a substrate with a processing liquid is selected from among a plurality of reference processing conditions, the substrate processing method comprising:
measuring a thickness of the target before being processed with the processing liquid at each of a plurality of measurement points on the target;
specifying a reference pattern having a high correlation with the thickness pattern among the reference patterns based on a prescriptive rule by comparison of a thickness pattern that represents a distribution of thicknesses measured at the measurement points to each of a plurality of reference patterns pre-stored in storage;
acquiring from the storage a reference processing condition, as the processing condition, associated with the specified reference pattern among the reference processing conditions associated with the respective reference patterns; and
processing the target with the processing liquid under the processing condition acquired from the storage, wherein
the reference patterns each represent a distribution of physical quantities of a corresponding one of reference targets,
the reference processing conditions each are a processing condition when processing with the processing liquid is previously performed on a corresponding one of the reference targets with a corresponding one of the reference patterns,
each of the plurality of reference patterns is pre-classified into any of a plurality of reference groups,
the reference groups are defined based on shape characteristics of the plurality of reference patterns, and
the specifying the reference pattern includes:
classifying the thickness pattern into any of the reference groups; and
determining the reference pattern having the high correlation with the thickness pattern by comparison of the thickness pattern to each of two or more reference patterns as to-be-referenced patterns among the plurality of reference patterns based on the prescriptive rule, the two or more reference patterns being reference patterns classified into the reference group into which the thickness pattern is classified.

2. The substrate processing method according to claim 1, wherein
the reference groups include at least one of a first reference group, a second reference group, and a third reference group,
the first reference group is a group of a pattern with a minimum spot between a center part and an edge part of the target or one of the reference targets,
the second reference group is a group of a pattern with a maximum spot between the center part and the edge part of the target or one of the reference targets, and
the third reference group is a group of a pattern inclining in one direction from the center part to the edge part of the target or one of the reference targets.

3. The substrate processing method according to claim 2, wherein
when a reference group of the reference groups into which the thickness pattern is classified is the first reference group, in the determining the reference group, comparison of a first difference based on the thickness pattern to each of second differences based on the respective reference patterns is performed and the reference pattern having the high correlation with the thickness pattern is determined based on a result of the comparison of the first difference to each of the second differences,
the first difference is a difference between a thickness of the target indicated by a minimum spot of the thickness pattern and a thickness of the edge part of the target indicated by an edge part of the thickness pattern, and
the second differences are differences between respective physical quantities of the reference targets indicated by the minimum spots of the respective reference patterns and respective physical quantities of the edge parts of the reference targets indicated by edge parts of the respective reference patterns.

4. The substrate processing method according to claim 2, wherein
when a reference group of the reference groups into which the thickness pattern is classified is the second reference group, in the determining the reference group, comparison of a first distance based on the thickness pattern to each of second distances based on the respective reference patterns is performed and the reference pattern having the high correlation with the thickness pattern is determined based on a result of the comparison of the first distance to each of the second distances,
the first distance is a distance from the center part of the target to a point corresponding to a maximum spot of the thickness pattern, and
the second distances are distances from the center parts of the respective reference targets to points corresponding to maximum spots of the respective reference patterns.

5. The substrate processing method according to claim 2, wherein
when a reference group of the reference groups into which the thickness pattern is classified is the third reference group, in the determining the reference group, comparison of an inclination of the thickness pattern to each of inclinations of the respective reference patterns is performed and the reference pattern having the high correlation with the thickness pattern is determine based on a result of the comparison of the inclination of the thickness pattern to each of the inclinations of the respective reference patterns.

6. The substrate processing method according to claim 1, wherein
the specifying the reference pattern includes
making a dimension of the thickness pattern and a dimension of the reference patterns the same as each other, and
in the determining the reference pattern, the reference pattern having the high correlation with the thickness pattern is determined based on the prescriptive rule after the making the dimension of the thickness pattern and the dimension of the reference patterns the same as each other.

7. The substrate processing method according to claim 1, further comprising:
displaying on a display device information utilized for specification or adjustment of the reference pattern having the high correlation with the thickness pattern of the target before being processed with the processing liquid or information utilized for evaluation of the thickness pattern of the target after being processed with the processing liquid.

8. The substrate processing method according to claim 1, wherein
the processing liquid is an etching liquid for etching the target, and
the physical quantities each are an etch rate or an etching amount.

9. The substrate processing method according to claim 1, wherein
the processing liquid is a removal liquid for removing the target, and
the physical quantities each are a removal rate or a removal amount.

10. The substrate processing method according to claim 1, further comprising:
measuring a thickness of the target after being processed with the processing liquid at each of the measurement points on the target after being processed.

11. The substrate processing method according to claim 10, further comprising
storing in association with each other the thickness pattern before the processing that represents the distribution of the thicknesses of the target before being processed, the reference pattern having a high correlation with the thickness pattern before the processing, the processing condition, and a thickness pattern after the processing that represents a distribution of thicknesses of the target after being processed in the storage.

12. The substrate processing method according to claim 10, further comprising:
storing in the storage the thickness pattern before the processing that represents the distribution of the thicknesses of the target before being processed, the reference pattern having a high correlation with the thickness pattern before the processing, the processing condition, a thickness pattern after the processing that represents a distribution of thicknesses of the target after being processed, and a result of the evaluation for the thickness pattern after the processing in association with each other.

13. A substrate product production method, wherein
the substrate is processed by the substrate processing method according to claim 1 to produce a substrate product that is the substrate after being processed.

14. A substrate processing method by which a processing condition usable in processing a target constituting a substrate with a processing liquid is selected from among a plurality of reference processing conditions, the substrate processing method comprising:
measuring a thickness of the target before being processed with the processing liquid at each of a plurality of measurement points on the target;
specifying a reference pattern having a high correlation with the thickness pattern among the reference patterns based on a prescriptive rule by comparison of a thickness pattern that represents a distribution of thicknesses measured at the measurement points to each of a plurality of reference patterns pre-stored in storage;
acquiring from the storage a reference processing condition, as the processing condition, associated with the specified reference pattern among the reference processing conditions associated with the respective reference patterns; and
processing the target with the processing liquid under the processing condition acquired from the storage, wherein
the reference patterns each represent a distribution of physical quantities of a corresponding one of reference targets,
the reference processing conditions each are a processing condition when processing with the processing liquid is previously performed on a corresponding one of the reference targets with a corresponding one of the reference patterns, and
each of the reference processing conditions includes information indicating a rotational speed of a substrate that includes a corresponding one of the reference targets, information indicating a turning point of a nozzle that discharges the processing liquid to the corresponding one of the reference targets, and information indicating a moving speed of the nozzle along the corresponding one of the reference targets.

15. The substrate processing method according to claim 14, further comprising
performing comparison of a first characteristic quantity indicating a characteristic of the thickness pattern to each of second characteristic quantities indicating characteristics of the respective reference patterns and adjusting the information indicating the moving speed of the nozzle included in the processing condition acquired in the acquiring from the storage based on a result of the comparison of the first characteristic quantity to each of the second characteristic quantities, wherein
the first characteristic quantity represents an extreme value of the thickness pattern, a thickness of a center part of the target indicated by the thickness pattern, or a thickness of an edge part of the target indicated by the thickness pattern, and
the second characteristic quantities represent respective extreme values of the reference patterns, respective reference physical quantities of center parts of the targets indicated by the respective reference patterns, or respective physical quantities of edge parts of the reference targets indicated by the respective reference patterns.

16. A substrate processing method by which a processing condition usable in processing a target constituting a substrate with a processing liquid is selected from among a plurality of reference processing conditions, the substrate processing method comprising:
measuring a thickness of the target before being processed with the processing liquid at each of a plurality of measurement points on the target;
specifying a reference pattern having a high correlation with the thickness pattern among the reference patterns based on a prescriptive rule by comparison of a thickness pattern that represents a distribution of thicknesses measured at the measurement points to each of a plurality of reference patterns pre-stored in storage;
acquiring from the storage a reference processing condition, as the processing condition, associated with the specified reference pattern among the reference processing conditions associated with the respective reference patterns; and
processing the target with the processing liquid under the processing condition acquired from the storage, wherein the reference patterns each represent a distribution of physical quantities of a corresponding one of reference targets, the reference processing conditions each are a processing condition when processing with the processing liquid is previously performed on a corresponding one of the reference targets with a corresponding one of the reference patterns, and in the specifying the reference pattern, the reference pattern having the high correlation with the thickness pattern is specified based on the prescriptive rule selected from among a plurality of prescriptive rules, a selection of which is indicated by a result of user input to an input device.

17. A substrate processing apparatus that selects a processing condition usable in processing a target constituting a substrate with a processing liquid from among a plurality of processing conditions, the substrate processing apparatus comprising:

a thickness measuring section configured to measure a thickness of the target before being processed with the processing liquid at each of a plurality of measurement points on the target;

storage that pre-stores therein a plurality of reference patterns that each represent a distribution of physical quantities of a corresponding one of the reference targets;

a specifying section configured to specify a reference pattern having a high correlation with the thickness pattern from among the reference patterns based on a prescriptive rule by comparison of a thickness pattern that represents a distribution of thicknesses measured at the respective measurement points to each of the reference patterns;

an acquiring section configured to acquire as the processing condition a reference processing condition associated with the specified reference pattern among reference processing conditions associated with the respective reference patterns from the storage; and a processing unit that processes the target with the processing liquid under the processing condition acquired from the storage, wherein the reference processing conditions each are a processing condition when processing with the processing liquid is previously performed on a corresponding one of the reference targets with a corresponding one of the reference patterns, and each of the reference processing conditions includes information indicating a rotational speed of a substrate that includes a corresponding one of the reference targets, information indicating a turning point of a nozzle that discharges the processing liquid to the corresponding one of the reference targets, and information indicating a moving speed of the nozzle along the corresponding one of the reference targets.

18. A non-transitory computer-readable recording medium that stores therein a computer program for selecting a processing condition usable in processing a target constituting a substrate with a processing liquid from among a plurality of reference processing conditions, wherein the computer program causes a computer to execute:

measuring a thickness of the target before being processed with the processing liquid at each of a plurality of measurement points on the target;

specifying a reference pattern having a high correlation with the thickness pattern among the reference patterns based on a prescriptive rule by comparison of a thickness pattern that represents a thickness distribution of thicknesses measured at the measurement points to each of a plurality of reference patterns pre-stored in storage;

acquiring from the storage a reference processing condition, as the processing condition, associated with the specified reference pattern among the reference processing conditions associated with the respective reference patterns; and causing a processing unit to process the target with the processing liquid under the processing condition acquired from the storage, wherein the reference patterns each represent a distribution of physical quantities of a corresponding one of reference targets, and the reference processing conditions each are a processing condition when processing with the processing liquid is previously performed on a corresponding one of the reference targets with a corresponding one of the reference patterns, and each of the reference processing conditions includes information indicating a rotational speed of a substrate that includes a corresponding one of the reference targets, information indicating a turning point of a nozzle that discharges the processing liquid to the corresponding one of the reference targets, and information indicating a moving speed of the nozzle along the corresponding one of the reference targets.

* * * * *